US012223763B2

(12) United States Patent
Koide et al.

(10) Patent No.: US 12,223,763 B2
(45) Date of Patent: Feb. 11, 2025

(54) DETECTION DEVICE

(71) Applicant: Japan Display Inc., Tokyo (JP)

(72) Inventors: Gen Koide, Tokyo (JP); Keiichi Saito, Tokyo (JP); Takashi Nakamura, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/225,838

(22) Filed: Jul. 25, 2023

(65) Prior Publication Data

US 2023/0368567 A1 Nov. 16, 2023

Related U.S. Application Data

(63) Continuation of application No. PCT/JP2022/002906, filed on Jan. 26, 2022.

(30) Foreign Application Priority Data

Jan. 26, 2021 (JP) .................................. 2021-010588

(51) Int. Cl.
*G06V 40/13* (2022.01)
*G06V 10/147* (2022.01)
*G06V 40/10* (2022.01)
*G06V 40/145* (2022.01)

(52) U.S. Cl.
CPC ........ *G06V 40/1318* (2022.01); *G06V 10/147* (2022.01); *G06V 40/145* (2022.01); *G06V 40/15* (2022.01)

(58) Field of Classification Search
CPC ............. G06V 40/1318; G06V 10/147; G06V 40/145; G06V 40/15; H01L 27/146; H04N 25/70
See application file for complete search history.

(56) References Cited

U.S. PATENT DOCUMENTS

| 2010/0238135 A1* | 9/2010 | Brown ................. G06F 3/0412 |
| | | 345/175 |
| 2012/0187455 A1 | 7/2012 | Brown et al. |
| 2012/0306374 A1* | 12/2012 | Lee ...................... G09G 3/3225 |
| | | 315/121 |

(Continued)

FOREIGN PATENT DOCUMENTS

| JP | 2012-194198 A | 10/2012 |
| JP | 2019-165130 A | 9/2019 |
| WO | WO2020/213619 A1 | 10/2020 |

OTHER PUBLICATIONS

International Search Report issued in International Patent Application No. PCT/JP2021/002906 on Apr. 5, 2022 and English translation of same. 5 pages.

(Continued)

*Primary Examiner* — Premal R Patel
(74) *Attorney, Agent, or Firm* — K&L Gates LLP

(57) ABSTRACT

According to an aspect, a detection device including a plurality of optical sensors arranged in a matrix having a row-column configuration, the detection device being configured to: detect a signal that is output from each of the optical sensors by reverse-biasing the optical sensor, and perform a refreshing operation to restore characteristics of the optical sensor to an initial state by forward-biasing the optical sensor for each predetermined period.

23 Claims, 33 Drawing Sheets

(56) References Cited

U.S. PATENT DOCUMENTS

| | | | |
|---|---|---|---|
| 2014/0167626 A1* | 6/2014 | Kim | H10K 59/128 |
| | | | 315/161 |
| 2017/0147865 A1* | 5/2017 | Jensen | G06V 40/1329 |
| 2018/0012069 A1 | 1/2018 | Chung et al. | |
| 2020/0314363 A1* | 10/2020 | Yang | H04N 25/74 |
| 2020/0359900 A1* | 11/2020 | Yan | A61B 5/02416 |
| 2021/0005771 A1 | 1/2021 | Tsubuku et al. | |
| 2021/0081638 A1* | 3/2021 | Lius | G02F 1/13338 |
| 2022/0165083 A1* | 5/2022 | Lin | G06F 3/04184 |
| 2022/0197469 A1* | 6/2022 | Lee | G06V 40/13 |
| 2023/0132555 A1* | 5/2023 | Inoue | G06V 10/145 |
| | | | 257/40 |

OTHER PUBLICATIONS

Written Opinion issued in International Patent Application No. PCT/JP2021/002906 on Apr. 5, 2022. 4 pages.

Office Action issued in related Japanese Patent Application No. 2021-010588, mailed on Aug. 6, 2024 and English translation of same. 6 pages.

\* cited by examiner

DETECTION DEVICE

CROSS-REFERENCE TO RELATED APPLICATION

This application is a continuation of PCT International Application Ser. No. PCT/JP2022/002906 filed on Jan. 26, 2022, which application claims the benefit of priority from Japanese Patent Application No. 2021-010588 filed on Jan. 26, 2021, the entire contents of which are incorporated herein by reference.

BACKGROUND

1. Technical Field

What is disclosed herein relates to a detection device.

2. Description of the Related Art

In these years, optical biometric sensors are known as biometric sensors used for personal authentication, for example. Fingerprint sensors (refer to United States Patent Application Publication No. 2018/0012069 (US-A-2018/0012069), for example) and vein sensors are known as such biometric sensors. In a fingerprint sensor described in US-A-2018/0012069, a plurality of photoelectric conversion elements such as photodiodes are arranged on a semiconductor substrate. Each of the photoelectric conversion elements outputs a signal that changes depending on the amount of light emitted thereto.

Organic photo detectors, such as organic photodiodes (OPDs), are known as the photoelectric conversion elements for detection. In detection devices using the OPDs, when variations are generated in an organic semiconductor layer, the characteristics of the OPDs may vary, whereby the detection accuracy is likely to be reduced.

For the foregoing reasons, there is a need for a detection device capable of improving the detection accuracy.

SUMMARY

According to an aspect, a detection device including a plurality of optical sensors arranged in a matrix having a row-column configuration, the detection device being configured to: detect a signal that is output from each of the optical sensors by reverse-biasing the optical sensor, and perform a refreshing operation to restore characteristics of the optical sensor to an initial state by forward-biasing the optical sensor for each predetermined period.

DETAILED DESCRIPTION

The following describes modes (embodiments) for carrying out the present disclosure in detail with reference to the drawings. The present disclosure is not limited to the description of the embodiments given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the disclosure. To further clarify the description, the drawings may schematically illustrate, for example, widths, thicknesses, and shapes of various parts as compared with actual aspects thereof. However, they are merely examples, and interpretation of the present disclosure is not limited thereto. The same component as that described with reference to an already mentioned drawing is denoted by the same reference sign through the description and the drawings, and detailed description thereof may not be repeated where appropriate.

In this disclosure, when an element is described as being "on" another element, the element can be directly on the other element, or there can be one or more elements between the element and the other element.

First Embodiment

Figure 1:
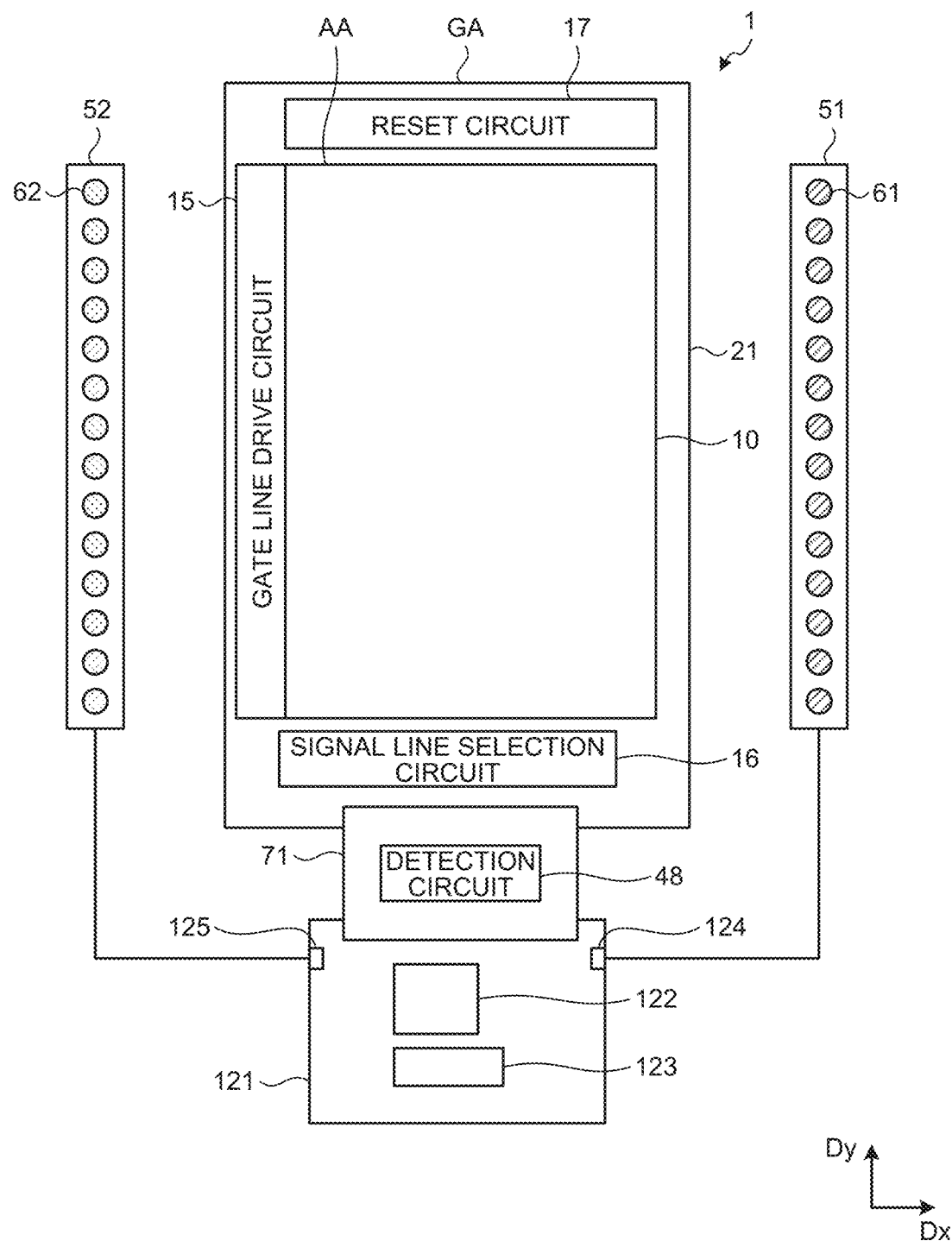
FIG. 1 is a plan view illustrating a detection device according to a first embodiment of the present disclosure.

FIG. 1 is a plan view illustrating a detection device according to a first embodiment of the present disclosure. As illustrated in FIG. 1, a detection device 1 includes a sensor base member 21, a sensor 10, a gate line drive circuit 15, a signal line selection circuit 16, a reset circuit 17, a detection circuit 48, a control circuit 122, a power supply circuit 123, a first light source base member 51, a second light source base member 52, a first light source 61, and a second light source 62. The first light source base member 51 is provided with a plurality of the first light sources 61. The second light source base member 52 is provided with a plurality of the second light sources 62.

The sensor base member 21 is electrically coupled to a control substrate 121 through a flexible printed circuit board 71. The flexible printed circuit board 71 is provided with the detection circuit 48. The control substrate 121 is provided with the control circuit 122 and the power supply circuit 123. In the present disclosure, the sensor base member 21 is provided with an organic semiconductor layer in which a plurality of optical sensors PD (organic photo diodes (OPDs)) described later are formed. A material sensitive to near-infrared light (for example, light having a wavelength of 850 nm) is used as the organic semiconductor layer.

The control circuit 122 is, for example, a field-programmable gate array (FPGA). The control circuit 122 supplies control signals to the sensor 10, the gate line drive circuit 15, the signal line selection circuit 16, and the reset circuit 17 to control a detection operation of the sensor 10. The control circuit 122 also supplies control signals to the first and the second light sources 61 and 62 to control lighting or non-lighting of the first and the second light sources 61 and 62.

The power supply circuit 123 supplies voltage signals including, for example, a sensor power supply potential VDDSNS (refer to FIG. 4) to the sensor 10, the gate line drive circuit 15, the signal line selection circuit 16, and the reset circuit 17. The power supply circuit 123 also supplies a power supply voltage to the first and the second light sources 61 and 62.

The sensor base member 21 has a detection area AA and a peripheral area GA. The detection area AA is an area provided with the optical sensors PD (refer to FIG. 4) included in the sensor 10. The peripheral area GA is an area between the outer perimeter of the detection area AA and the ends of the sensor base member 21, and is an area not provided with the optical sensors PD.

The gate line drive circuit 15, the signal line selection circuit 16, and the reset circuit 17 are provided in the peripheral area GA. Specifically, the gate line drive circuit 15 is provided in an area extending along a second direction Dy in the peripheral area GA. The signal line selection circuit 16 is provided in an area extending along a first direction Dx in the peripheral area GA, and is provided between the sensor 10 and the detection circuit 48. The reset circuit 17 is provided in an area extending along the first direction Dx in the peripheral area GA. FIG. 1 illustrates an example of providing the reset circuit 17 on the upper side of the sensor 10 in the figure. However, in an aspect, the reset circuit 17 may be provided between the sensor 10 and the detection circuit 48 in the same manner as the signal line selection circuit 16.

The first direction Dx is one direction in a plane parallel to the sensor base member 21. The second direction Dy is one direction in the plane parallel to the sensor base member 21, and is a direction orthogonal to the first direction Dx. The second direction Dy may non-orthogonally intersect the first direction Dx. A third direction Dz is a direction orthogonal to the first direction Dx and the second direction Dy, and is a direction normal to the sensor base member 21.

The first light sources 61 are provided on the first light source base member 51, and are arranged along the second direction Dy. The second light sources 62 are provided on the second light source base member 52, and are arranged along the second direction Dy. The first light source base member 51 and the second light source base member 52 are electrically coupled, through terminals 124 and 125, respectively, provided on the control substrate 121, to the control circuit 122 and the power supply circuit 123.

For example, inorganic light-emitting diodes (LEDs) or organic electroluminescent (EL) diodes (organic light-emitting diodes (OLEDs)) are used as the first and the second light sources 61 and 62.

Light emitted from the first light source 61 and the second light source is mainly reflected on a surface of or in an object to be detected, such as a finger Fg, and is incident on the sensor 10. As a result, the sensor 10 can detect a shape of asperities on the surface of the finger Fg or the like, and information on a living body in the finger Fg or the like. Examples of the information on the living body include pulse waves, pulsation, and a vascular image of the finger Fg or a palm. That is, the detection device 1 may be configured as a fingerprint detection device to detect a fingerprint or a vein detection device to detect a vascular pattern of, for example, veins.

In an aspect, light emitted from the first light sources 61 and light emitted from the second light sources 62 may have different wavelengths from each other. Thus, the detection device 1 can detect the various information on the living body by performing the detection based on the light emitted from the first light sources 61 and the detection based on the light emitted from the second light sources 62.

The arrangement of the first and the second light sources 61 and 62 illustrated in FIG. 1 is merely an example, and may be changed as appropriate. The detection device 1 is provided with a plurality of types of light sources (first and second light sources 61 and 62) as the light sources. However, the light sources are not limited thereto and may be of one type. For example, the first and the second light sources 61 and 62 may be arranged on each of the first and the second light source base members 51 and 52. The first and the second light sources 61 and 62 may be provided on one light source base member, or three or more light source base members. Alternatively, only at least one light source needs to be disposed. The light source may be what is called a direct-type backlight that is provided directly below the detection area AA.

Figure 2:
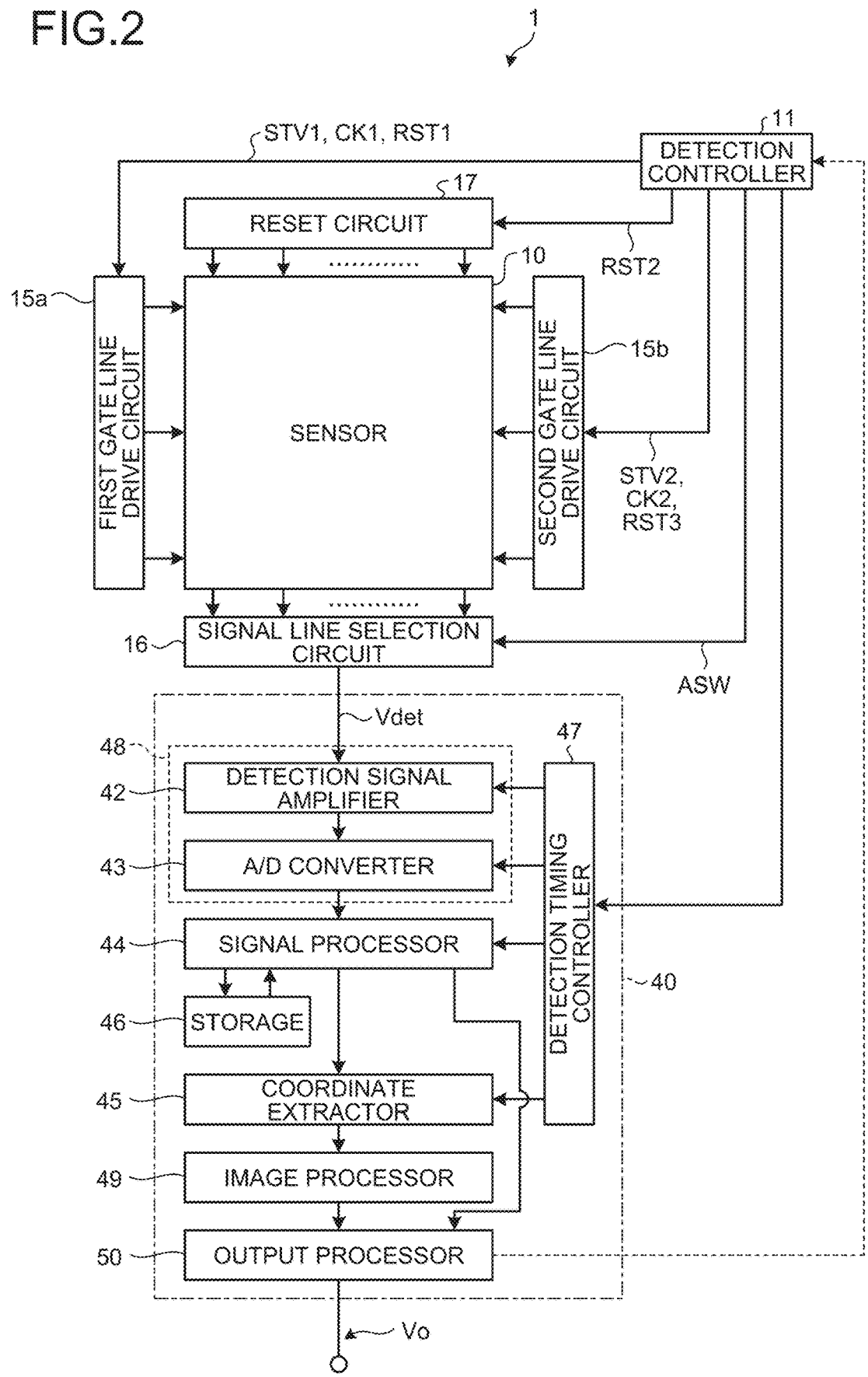
FIG. 2 is a block diagram illustrating a configuration example of the detection device according to the first embodiment.

FIG. 2 is a block diagram illustrating a configuration example of the detection device according to the first embodiment. As illustrated in FIG. 2, the detection device 1 further includes a detection controller (detection control circuit) 11 and a detector (detection signal processing circuit) 40. The control circuit 122 includes one, some, or all functions of the detection controller 11. The control circuit 122 also includes one, some, or all functions of the detector 40 other than those of the detection circuit 48.

Figure 4:
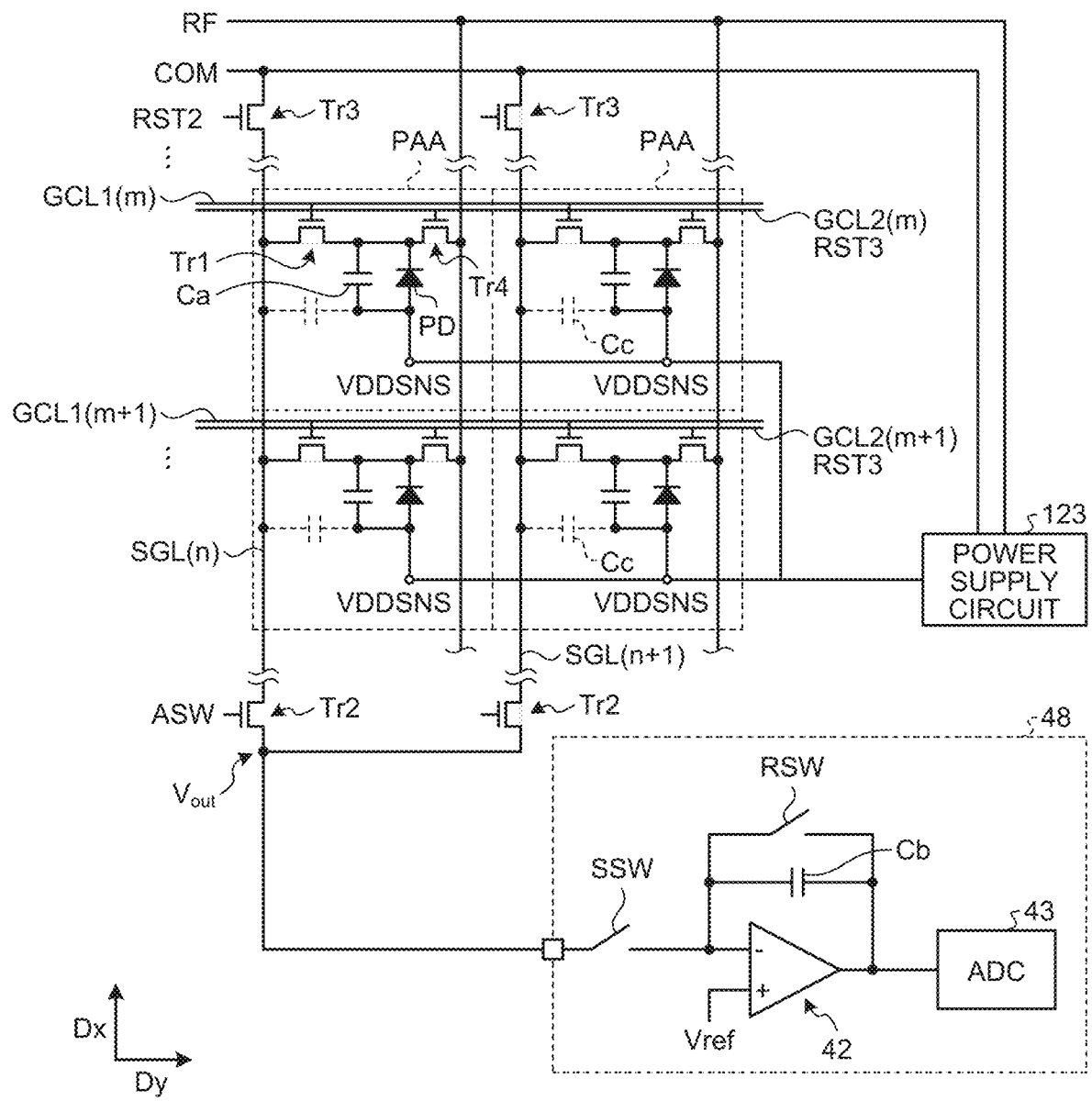
FIG. 4 is a circuit diagram illustrating a plurality of partial detection areas of the detection device according to the first embodiment.

The sensor 10 includes the optical sensors PD (refer to FIG. 4). Each of the optical sensors PD is a photoelectric conversion element, and outputs an electrical signal corresponding to light emitted thereto as a detection signal Vdet to the signal line selection circuit 16. In the present disclosure, the optical sensor PD is an organic photo diode (OPD). The sensor 10 performs the detection according to a gate drive signal Vgcl supplied from the gate line drive circuit 15.

The detection controller 11 is a circuit that supplies respective control signals to the gate line drive circuit 15, the signal line selection circuit 16, and the detector 40 to control operations of these components. The detection controller 11 supplies various control signals including, for example, a start signal STV, a clock signal CK, and a reset signal RST1 to the gate line drive circuit 15. The detection controller 11 also supplies various control signals including, for example, a selection signal ASW to the signal line selection circuit 16. The detection controller 11 also supplies various control signals to the first and the second light sources 61 and 62 to control the lighting and the non-lighting of each group of the first and the second light sources 61 and 62.

In the first embodiment, the gate line drive circuit 15 includes a first gate line drive circuit 15a and a second gate line drive circuit 15b.

The first gate line drive circuit 15a is a circuit that drives a plurality of first gate lines GCL1 (refer to FIG. 3) based on various control signals. The first gate line drive circuit 15a sequentially or simultaneously selects the first gate lines GCL1 and supplies the gate drive signals Vgcl to the selected first gate lines GCL1. By this operation, the first gate line drive circuit 15a selects the optical sensors PD electrically coupled to the first gate lines GCL1, and supplies the gate drive signals Vgcl to the selected optical sensors PD.

The second gate line drive circuit 15b is a circuit that drives a plurality of second gate lines GCL2 (refer to FIG. 3) based on various control signals. The second gate line drive circuit 15b sequentially or simultaneously selects the second gate lines GCL2 and supplies a refreshing signal RST3 to the selected second gate lines GCL2. By this operation, the second gate line drive circuit 15b selects the optical sensors PD electrically coupled to the second gate lines GCL2, and supplies a forward bias potential RF to the selected optical sensors PD.

Figure 3:
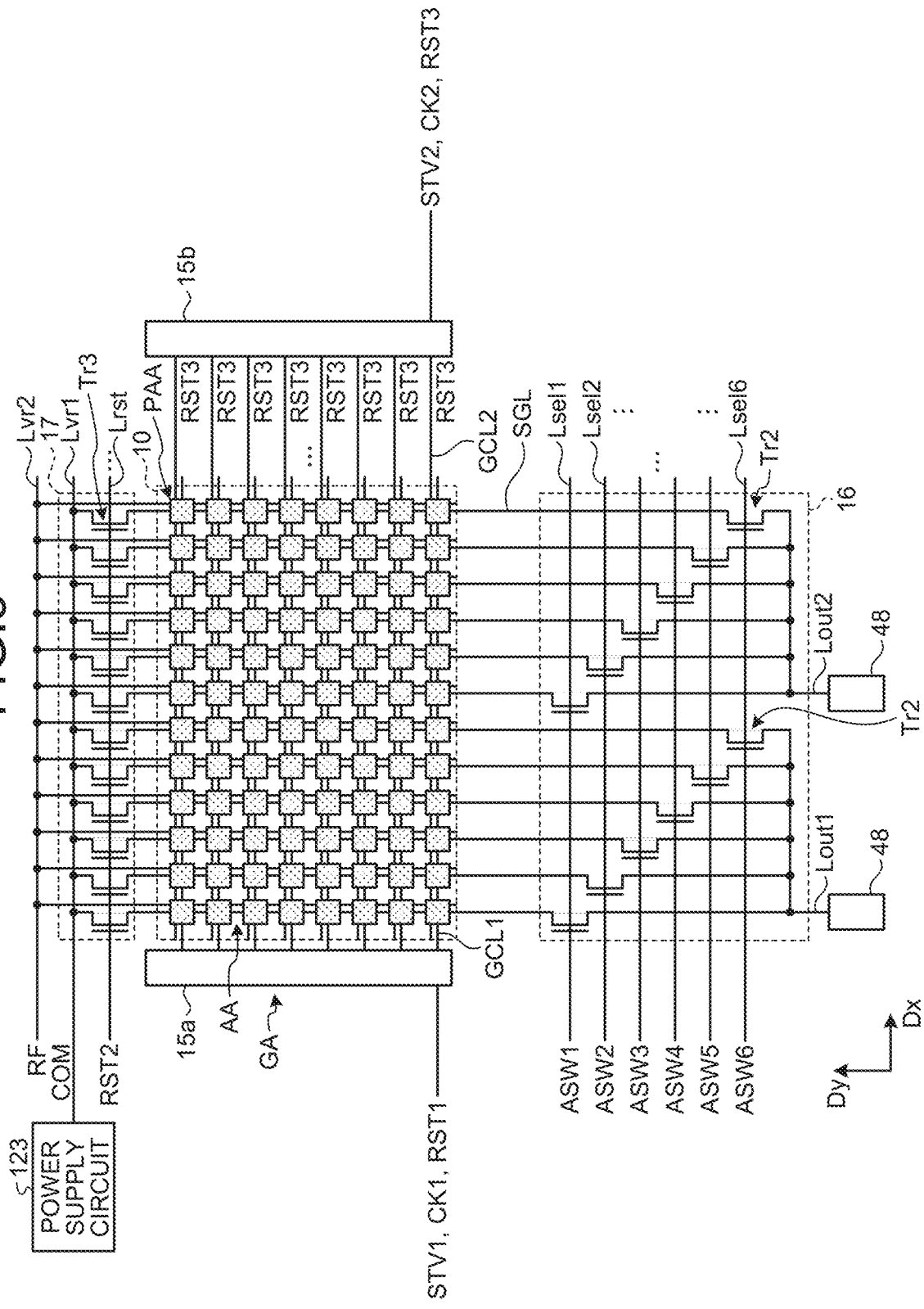
FIG. 3 is a circuit diagram illustrating the detection device according to the first embodiment.

The signal line selection circuit 16 is a switch circuit that sequentially or simultaneously selects a plurality of signal lines SGL (refer to FIG. 3). The signal line selection circuit 16 is, for example, a multiplexer. The signal line selection circuit 16 electrically couples the selected signal lines SGL to the detection circuit 48 based on the selection signal ASW supplied from the detection controller 11. Through this operation, the signal line selection circuit 16 outputs the detection signals Vdet of the optical sensors PD to the detector 40.

The reset circuit 17 is a switch circuit that simultaneously selects more than one of the signal lines SGL (refer to FIG. 3) and applies a reference potential COM to reverse-bias the optical sensors PD. The reset circuit 17 is, for example, a multiplexer. The reset circuit 17 supplies the reference potential COM to each of the signal lines SGL based on a second reset signal RST2 supplied from the detection controller 11.

The detector 40 includes the detection circuit 48, a signal processor (signal processing circuit) 44, a coordinate extractor (coordinate extraction circuit) 45, a storage (storage circuit) 46, a detection timing controller (detection timing control circuit) 47, an image processor (image processing circuit) 49, and an output processor (output processing circuit) 50. Based on a control signal supplied from the detection controller 11, the detection timing controller 47 controls the detection circuit 48, the signal processor 44, the coordinate extractor 45, and the image processor 49 so as to operate in synchronization with one another.

The detection circuit 48 is, for example, an analog front-end (AFE) circuit. The detection circuit 48 is a signal processing circuit having functions of at least a detection signal amplifier 42 and an analog-to-digital (A/D) converter 43. The detection signal amplifier 42 amplifies the detection signal Vdet. The A/D converter 43 converts an analog signal output from the detection signal amplifier 42 into a digital signal.

The signal processor 44 is a logic circuit that detects a predetermined physical quantity received by the sensor 10 based on an output signal of the detection circuit 48. The signal processor 44 can detect the asperities on the surface of the finger Fg or the palm based on the signals from the detection circuit 48 when the finger Fg is in contact with or in proximity to a detection surface. The signal processor 44 can also detect the information on the living body based on the signals from the detection circuit 48. Examples of the information on the living body include the vascular image, the pulse waves, the pulsation, and a blood oxygen level of the finger Fg or the palm.

The signal processor 44 may also perform processing of acquiring the detection signals Vdet (information on the living body) simultaneously detected by the optical sensors PD, and averaging the detection signals Vdet. In this case, the detector 40 can perform stable detection by reducing measurement errors caused by noise or relative positional misalignment between the object to be detected, such as the finger Fg, and the sensor 10.

The storage 46 temporarily stores therein signals calculated by the signal processor 44. The storage 46 may be, for example, a random-access memory (RAM) or a register circuit.

The coordinate extractor 45 is a logic circuit that obtains detected coordinates of the asperities on the surface of the finger or the like when the contact or the proximity of the finger is detected by the signal processor 44. The coordinate extractor 45 is the logic circuit that also obtains detected coordinates of blood vessels of the finger Fg or the palm. The image processor 49 combines the detection signals Vdet output from the respective optical sensors PD of the sensor 10 to generate two-dimensional information indicating the shape of the asperities on the surface of the finger Fg or the like and two-dimensional information indicating the shape of the blood vessels of the finger Fg or the palm. The coordinate extractor 45 may output the detection signals Vdet as sensor outputs Vo instead of calculating the detected coordinates. A case can be considered where the detector 40 does not include the coordinate extractor 45 and the image processor 49.

The output processor 50 serves as a processor that performs processing based on the outputs from the optical sensors PD. Specifically, the output processor 50 of the present embodiment outputs the sensor outputs Vo including at least pulse wave data based on at least the detection signals Vdet acquired through the signal processor 44. In the present embodiment, the signal processor 44 outputs data indicating a variation (amplitude) in output of the detection signal Vdet of each of the optical sensors PD (described later), and the output processor 50 determines which outputs are to be employed as the sensor outputs Vo. However, the signal processor 44 or the output processor 50 may perform both these operations. The output processor 50 may include, for example, the detected coordinates obtained by the coordinate extractor 45 and the two-dimensional information generated by the image processor 49 in the sensor outputs Vo. The function of the output processor 50 may be integrated into another component (for example, the image processor 49).

The following describes a circuit configuration example of the detection device 1. FIG. 3 is a circuit diagram illustrating the detection device according to the first embodiment. As illustrated in FIG. 3, the sensor 10 has a plurality of partial detection areas PAA arranged in a matrix having a row-column configuration. Each of the partial detection areas PAA is provided with the optical sensor PD.

The first gate lines GCL1 extend in the first direction Dx and are each coupled to the partial detection areas PAA arranged in the first direction Dx. The first gate lines GCL1 are arranged in the second direction Dy and are each coupled to the first gate line drive circuit 15a. For ease of understanding of the description, FIG. 3 illustrates eight of the first gate lines GCL1. However, this is merely an example. The number of the first gate lines GCL1 is not limited to this example.

The second gate lines GCL2 extend in the first direction Dx and are each coupled to the partial detection areas PAA arranged in the first direction Dx. The second gate lines GCL2 are arranged in the second direction Dy and are each coupled to the second gate line drive circuit 15b. For ease of understanding of the description, FIG. 3 illustrates eight of the second gate lines GCL2. However, this is merely an example. The number of the second gate lines GCL2 is not limited to this example.

The signal lines SGL extend in the second direction Dy and are each coupled to the optical sensors PD of the partial detection areas PAA arranged in the second direction Dy. The signal lines SGL are arranged in the first direction Dx, and are each coupled to the signal line selection circuit 16 and the reset circuit 17. For ease of understanding of the description, FIG. 3 illustrates 12 of the signal lines SGL. However, this is merely an example. The number of the signal lines SGL is not limited to this example.

In FIG. 3, the sensor 10 is provided between the signal line selection circuit 16 and the reset circuit 17. The present disclosure is not limited thereto. The signal line selection circuit 16 and the reset circuit 17 may be coupled to ends of the signal lines SGL in the same direction.

The first gate line drive circuit 15a receives various control signals including, for example, a start signal STV1, a clock signal CK1, and a first reset signal RST1 from the control circuit 122 (refer to FIG. 1). The first gate line drive circuit 15a sequentially selects the first gate lines GCL1 in a time-division manner based on the various control signals. The first gate line drive circuit 15a supplies the gate drive signal Vgcl to the selected first gate lines GCL1. This operation supplies the gate drive signal Vgcl to a plurality of first switching elements Tr1 (refer to FIG. 4) coupled to the first gate line GCL1, and the partial detection areas PAA arranged in the first direction Dx are selected as detection targets.

The first gate line drive circuit 15a may perform different driving for different detection modes including the detection of the fingerprint and the detection of different items of the information on the living body (such as the pulse waves, the pulsation, the vascular image, and the blood oxygen level). For example, the first gate line drive circuit 15a may collectively drive more than one of the first gate lines GCL1.

The second gate line drive circuit 15b receives various control signals including, for example, a start signal STV2, a clock signal CK2, and the refreshing signal RST3 from the control circuit 122 (refer to FIG. 1). The second gate line drive circuit 15b sequentially selects the second gate lines GCL2 in a time-division manner based on the various control signals. The second gate line drive circuit 15b supplies the refreshing signal RST3 to the selected second gate lines GCL2. This operation supplies the refreshing signal RST3 to a plurality of fourth switching elements Tr4 (refer to FIG. 4) coupled to the second gate line GCL2, and the partial detection areas PAA arranged in the first direction Dx are selected as the detection targets.

The second gate line drive circuit 15b supplies the refreshing signal RST3 to the second gate line GCL2. This operation turns on the fourth switching elements Tr4 (refer to FIG. 4) and thus electrically couples the selected second gate line GCL2 to a forward bias potential line Lvr2. The power supply circuit 123 supplies the forward bias potential RF to the forward bias potential line Lvr2. This operation supplies the forward bias potential RF to the cathode of the optical sensor PD (refer to FIG. 4) included in each of the partial detection areas PAA. In the present disclosure, the forward bias potential RF is −2 V, for example.

The second gate line drive circuit 15b may perform different driving for the different detection modes including the detection of the fingerprint and the detection of different items of the information on the living body (such as the pulse waves, the pulsation, the vascular image, and the blood oxygen level). For example, the second gate line drive circuit 15*b* may collectively drive more than one of the second gate lines GCL2.

The signal line selection circuit 16 includes a plurality of selection signal lines Lsel, a plurality of output signal lines Lout, and second switching elements Tr2. The second switching elements Tr2 are provided correspondingly to the respective signal lines SGL. Six of the 12 signal lines SGL illustrated in FIG. 3 are coupled to an output signal line Lout1 common thereto. Six of the 12 signal lines SGL illustrated in FIG. 3 are coupled to an output signal line Lout2 common thereto. The output signal lines Lout1 and Lout2 are each coupled to the detection circuit 48.

The control circuit 122 (refer to FIG. 1) sequentially supplies the selection signal ASW to the selection signal lines Lsel. This operation causes the signal line selection circuit 16 to operate the second switching elements Tr2 to sequentially select the signal lines SGL in one signal line block in a time-division manner. The signal line selection circuit 16 selects one of the signal lines SGL in each of the signal line blocks. With the above-described configuration, the detection device 1 can reduce the number of integrated circuits (ICs) including the detection circuit 48 or the number of terminals of the ICs. The signal line selection circuit 16 may collectively electrically couple more than one of the signal lines SGL to the detection circuit 48.

As illustrated in FIG. 3, the reset circuit 17 includes a reference potential line Lvr1, a reset signal line Lrst, and third switching elements Tr3. The third switching elements Tr3 are provided correspondingly to the signal lines SGL. The reference potential line Lvr1 is coupled to either the sources or the drains of the third switching elements Tr3. The reset signal line Lrst is coupled to the gates of the third switching elements Tr3.

The control circuit 122 supplies the second reset signal RST2 to the reset signal line Lrst. This operation turns on the third switching elements Tr3 to electrically couple the signal lines SGL to the reference potential line Lvr1. The power supply circuit 123 supplies the reference potential COM to the reference potential line Lvr1. This operation supplies the reference potential COM to a capacitive element Ca (refer to FIG. 4) included in each of the partial detection areas PAA. In the present disclosure, the reference potential COM is 0.75 V, for example.

FIG. 4 is a circuit diagram illustrating the partial detection areas of the detection device according to the first embodiment. FIG. 4 also illustrates a circuit configuration of the detection circuit 48. As illustrated in FIG. 4, each of the partial detection areas PAA includes the optical sensor PD, the capacitive element Ca, the first switching element Tr1, and the fourth switching element Tr4. The capacitive element Ca is capacitance (sensor capacitance) generated in the optical sensor PD, and is equivalently coupled in parallel to the optical sensor PD. In addition, signal line capacitance Cc is parasitic capacitance generated on each of the signal lines SGL, and is equivalently generated between the signal line SGL and a node between the anode of the optical sensor PD and one end side of the capacitive element Ca.

FIG. 4 illustrates two first gate lines GCL1(*m*), GCL1(*m*+1) arranged in the second direction Dy among the first gate lines GCL1. FIG. 4 also illustrates two second gate lines GCL2(*m*), GCL2(*m*+1) arranged in the second direction Dy among the second gate lines GCL2. FIG. 4 also illustrates two signal lines SGL(n) and SGL(n+1) arranged in the first direction Dx among the signal lines SGL. The partial detection area PAA is an area surrounded by the gate lines GCL (first and second gate lines GCL1 and GCL2) and the signal lines SGL.

Each of the first switching elements Tr1 is provided correspondingly to the optical sensor PD. The first switching element Tr1 is formed of a thin-film transistor, and in this example, formed of an n-channel metal oxide semiconductor (MOS) thin-film transistor (TFT).

The gates of the first switching elements Tr1 belonging to the partial detection areas PAA arranged in the first direction Dx are coupled to the first gate line GCL1. The sources of the first switching elements Tr1 belonging to the partial detection areas PAA arranged in the second direction Dy are coupled to the signal line SGL. The drain of the first switching element Tr1 is coupled to the cathode of the optical sensor PD and the capacitive element Ca.

The gates of the fourth switching elements Tr4 belonging to the partial detection areas PAA arranged in the first direction Dx are coupled to the second gate line GCL2. The sources of the fourth switching elements Tr4 belonging to the plurality of partial detection areas PAA arranged in the second direction Dy are coupled to the forward bias potential line Lvr2. The drain of each of the fourth switching elements Tr4 is coupled to the cathode of the optical sensor PD and the capacitive element Ca.

The anode of the optical sensor PD is supplied with the sensor power supply potential VDDSNS from the power supply circuit 123. In the present disclosure, the sensor power supply potential VDDSNS is −1.25 V, for example. The signal line SGL, the cathode of the optical sensor PD, and the capacitive element Ca are supplied with the reference potential COM that serves as an initial potential of the capacitive element Ca from the power supply circuit 123 through the third switching element Tr3. The signal line SGL, the cathode of the optical sensor PD, and the capacitive element Ca are supplied with the forward bias potential RF that serves as a refreshing potential of the optical sensor PD from the power supply circuit 123 through the fourth switching element Tr4.

When the partial detection area PAA is irradiated with light, a current corresponding to the amount of the light flows through the optical sensor PD. As a result, an electric charge is stored in the capacitive element Ca. After the first switching element Tr1 is turned on, a current corresponding to the electric charge stored in the capacitive element Ca flows through the signal line SGL. The signal line SGL is electrically coupled to the detection circuit 48 through a corresponding one of the second switching elements Tr2 of the signal line selection circuit 16. Thus, the detection device 1 can detect a signal corresponding to the amount of the light received by the optical sensor PD in each of the partial detection areas PAA.

After the first and the third switching elements Tr1 and Tr3 are turned on and the fourth switching element Tr4 is turned off, the capacitive element Ca is supplied with the reference potential COM. This operation resets the capacitive element Ca to the initial potential (reference potential COM).

After the first and the third switching elements Tr1 and Tr3 are turned off and the fourth switching element Tr4 is turned on, the cathode of the optical sensor PD is supplied with the forward bias potential RF. With this operation, the optical sensor PD is forward-biased and refreshed.

During a read period Pdet (refer to FIG. 6), a switch SSW of the detection circuit 48 is turned on, and the detection circuit 48 is electrically coupled to the signal lines SGL. The detection signal amplifier 42 of the detection circuit 48 converts a current supplied from the signal line SGL into a voltage corresponding to the value of the current, and amplifies the result. A reference potential (Vref) having a fixed potential is supplied to a non-inverting input terminal (+) of the detection signal amplifier 42, and the signal lines SGL are electrically coupled to an inverting input terminal (−) of the detection signal amplifier 42. In the present embodiment, the same signal as the reference potential COM is supplied as the reference potential (Vref). The detection signal amplifier 42 includes a capacitive element Cb and a reset switch RSW. During a first reset period Prst1 (refer to FIG. 6), the reset switch RSW is turned on, and the electric charge of the capacitive element Cb is reset.

If variations are present in the organic semiconductor layer where the optical sensor PD (organic photodiode (OPD)) is formed, the characteristics of the OPD may vary, whereby the detection accuracy is likely to be reduced. The following describes the diode characteristics of the optical sensor PD when variations are present in the organic semiconductor layer, with reference to FIG. 5.

Figure 5:
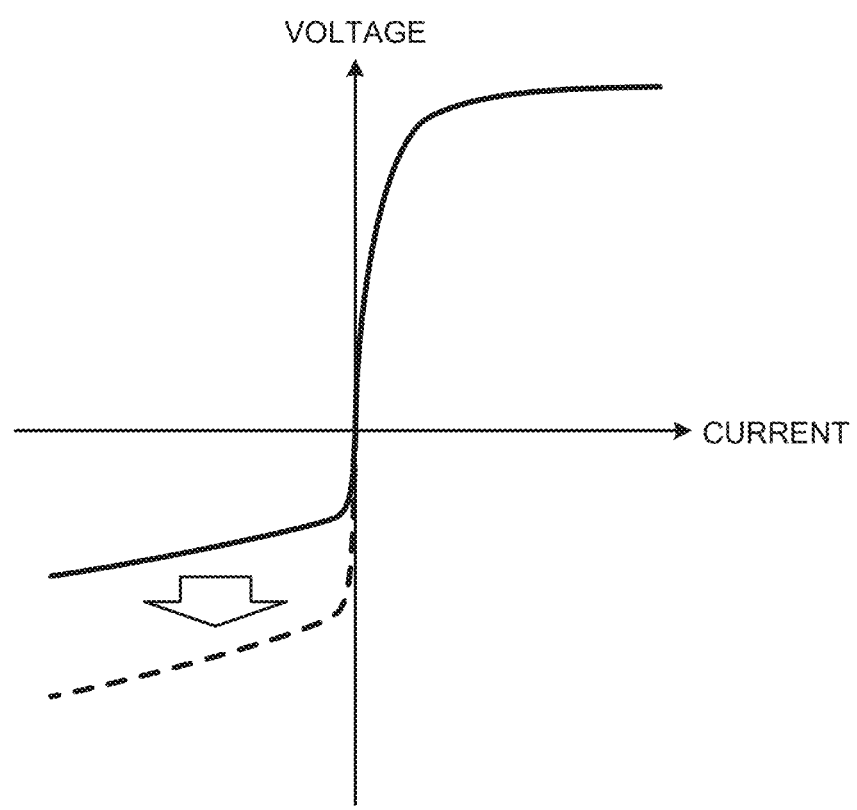
FIG. 5 is a diagram illustrating exemplary diode characteristics of an optical sensor.

FIG. 5 is a diagram illustrating an example of the diode characteristics of the optical sensor. In FIG. 5, the horizontal axis represents the current, and the vertical axis represents the voltage. In FIG. 5, the solid line indicates the diode characteristics under normal conditions, and the dashed line indicates an example of a change in the characteristics due to variations in characteristics of the OPD.

The variations in the organic semiconductor layer where the optical sensor PD (organic photodiode (OPD)) is formed may cause a change in reverse characteristics of the OPD as illustrated with the dashed line. As a result, a reverse current flowing through the optical sensor PD during an exposure period (effective exposure period) (described below) varies from partial detection area PAA to partial detection area PAA, resulting in a reduction in detection accuracy.

In the present embodiment, the characteristics of the OPD are restored to the initial state (solid line illustrated in FIG. 5) by applying a forward bias current to the optical sensor PD at predetermined timing. In the present disclosure, this operation to restore the characteristics of the OPD to the initial state is called "refreshing operation". The following describes an operation example of the detection device 1 according to the first embodiment with reference to FIGS. 6 and 7.

Figure 6:
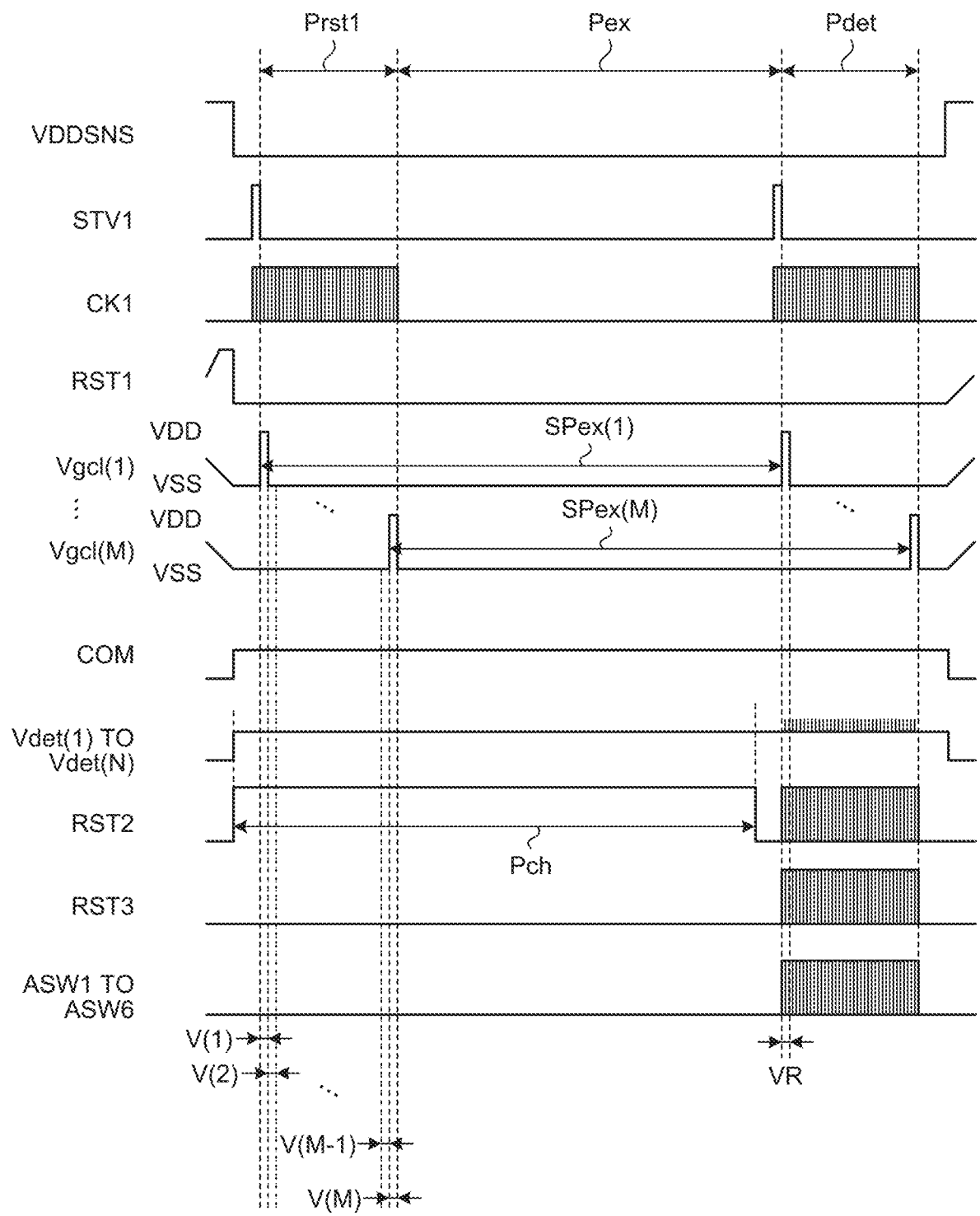
FIG. 6 is a waveform timing chart illustrating an operation example of the detection device according to the first embodiment.
Figure 7:
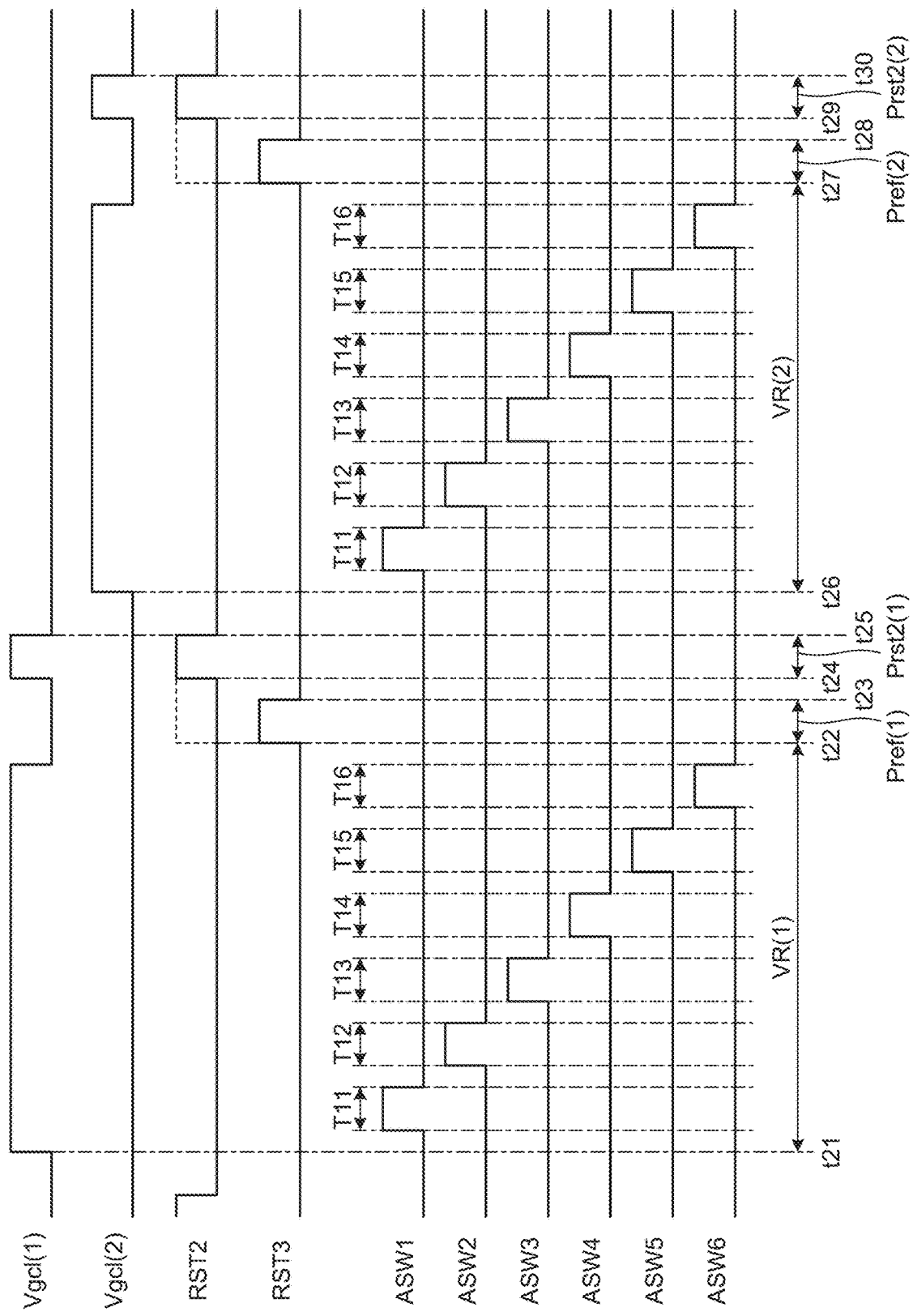
FIG. 7 is a waveform timing chart illustrating an operation example during a read period of the detection device according to the first embodiment.

FIG. 6 is a waveform timing chart illustrating the operation example of the detection device according to the first embodiment. FIG. 7 is a waveform timing chart illustrating an operation example during the read period of the detection device according to the first embodiment.

As illustrated in FIG. 6, the detection device 1 according to the first embodiment has the first reset period Prst1, an exposure period Pex, and the read period Pdet. The power supply circuit 123 supplies the sensor power supply potential VDDSNS to the anode of the optical sensor PD over the first reset period Prst1, the exposure period Pex, and the read period Pdet. For example, the reference potential COM of substantially 0.75 V is applied to the cathode of the optical sensor PD. By applying the sensor power supply potential VDDSNS of substantially −1.25 V to the anode, a reverse bias of substantially 2.0 V is applied between the anode and the cathode. The control circuit 122 sets the second reset signal RST2 to "H", and then, supplies the start signal STV and a first clock signal CK1 to the gate line drive circuit 15 to start the first reset period Prst1. During the first reset period Prst1, the control circuit 122 supplies the reference potential COM to the reset circuit 17 and uses the second reset signal RST2 to turn on the third switching elements Tr3 for supplying the reference potential COM. This operation supplies the reference potential COM to each of the signal lines SGL. The reference potential COM is set to 0.75 V, for example.

During the first reset period Prst1, the first gate line drive circuit 15a sequentially selects each of the first gate lines GCL1 based on the first start signal STV1, the first clock signal CK1, and the first reset signal RST1. The first gate line drive circuit 15a sequentially supplies the gate drive signals Vgcl (Vgcl(1), ..., Vgcl(M)) to the first gate lines GCL1. Each of the gate drive signals Vgcl has a pulsed waveform having a power supply voltage VDD serving as a high-level voltage and a power supply voltage VSS serving as a low-level voltage. In FIG. 6, M first gate lines GCL1 (where M is, for example, 256) are provided, and the gate drive signals Vgcl(1), ..., Vgcl(M) are sequentially supplied to the respective first gate lines GCL1. Thus, the first switching elements Tr1 are sequentially brought into a conducting state and supplied with the reference potential COM on a row-by-row basis. As a result, the capacitance of the capacitive elements Ca is reset.

Specifically, the first gate line drive circuit 15a supplies the gate drive signal Vgcl(1) at the high-level voltage (power supply voltage VDD) to the first gate line GCL1(1) during a period V(1). The control circuit 122 supplies any one of the selection signals ASW1, ..., ASW6 (for example, the selection signal ASW1) to the signal line selection circuit 16 during a period in which the gate drive signal Vgcl(1) is at the high-level voltage (power supply voltage VDD). This operation electrically couples the signal line SGL of the partial detection area PAA selected by the gate drive signal Vgcl(1) to the detection circuit 48. As a result, the reference potential COM is also supplied to coupling wiring between the second switching elements Tr2 and the detection circuit 48.

In the same manner, the first gate line drive circuit 15a supplies the gate drive signals Vgcl(2), ..., Vgcl(M−1), Vgcl(M) at the high-level voltage to first gate lines GCL1 (2), ..., GCL1(M−1), GCL1(M) during periods V(2), ..., V(M−1), V(M), respectively.

Thus, during the first reset period Prst1, the capacitive elements Ca of all the partial detection areas PAA are sequentially electrically coupled to the signal lines SGL, and are supplied with the reference potential COM. As a result, the capacitance of the capacitive elements Ca is reset. The capacitance of the capacitive elements Ca of some of the partial detection areas PAA can be reset by partially selecting the first gate lines GCL1 and the signal lines SGL.

Examples of the method of controlling the exposure include a method of controlling the exposure during non-selection of the gate lines and a method of always controlling the exposure. In the method of controlling the exposure during non-selection of the gate lines, the gate drive signals (Vgcl(1), ..., Vgcl(M)) are sequentially supplied to all the first gate lines GCL1 electrically coupled to the optical sensors PD serving as the detection targets, and all the optical sensors PD serving as the detection targets are supplied with the reference potential COM. Then, after all the first gate lines GCL1 electrically coupled to the optical sensors PD serving as the detection targets are set to a low voltage (the first switching elements Tr1 are turned off), the exposure starts and the exposure is performed during the exposure period Pex. After the exposure ends, the gate drive signals (Vgcl(1), ..., Vgcl(M)) are sequentially supplied to the first gate lines GCL1 electrically coupled to the optical sensors PD serving as the detection targets as described above, and reading is performed during the read period Pdet.

In the method of always controlling the exposure, the control for performing the exposure can also be performed during the first reset period Prst1 and the read period Pdet (the exposure is always controlled). In this case, an effective exposure period SPex(1) starts immediately after the gate drive signal Vgcl(1) is supplied to the first gate line GCL1 in the first reset period Prst1. Herein, each of the effective exposure periods SPex((1), . . . , SPex(M)) refers to a period during which the capacitive elements Ca are charged from the optical sensors PD. That is, in the method of always controlling the exposure, each of the effective exposure periods SPex((1), . . . , SPex(M)) starts when the first switching element Tr1 is turned off. The electric charge stored in the capacitive element Ca during the first reset period Prst1 flows as a reverse current (from cathode to anode) through the optical sensor PD due to light irradiation, and the potential difference in the capacitive element Ca decreases. The start timing and the end timing of the actual effective exposure periods SPex(1), . . . , SPex(M) are different among the partial detection areas PAA corresponding to the respective first gate lines GCL1. Each of the effective exposure periods SPex(1), . . . , SPex(M) starts when the gate drive signal Vgcl changes from the power supply voltage VDD serving as the high-level voltage to the power supply voltage VSS serving as the low-level voltage in the first reset period Prst1. Each of the effective exposure periods SPex(1), . . . , SPex(M) ends when the gate drive signal Vgcl changes from the power supply voltage VSS to the power supply voltage VDD in the read period Pdet. The lengths of the effective exposure periods SPex(1), . . . , SPex(M) are equal.

In the method of controlling the exposure during non-selection of the gate lines, a current flows correspondingly to the light received by the optical sensor PD in each of the partial detection areas PAA during the effective exposure periods SPex(1), . . . , SPex(M). As a result, an electric charge is stored in each of the capacitive elements Ca.

At a time before the read period Pdet starts, the control circuit 122 sets the second reset signal RST2 to a low-level voltage. This operation stops the operation of the reset circuit 17.

During the read period Pdet, the first gate line drive circuit 15a sequentially supplies the gate drive signals Vgcl(1), . . . , Vgcl(M) to the first gate lines GCL1 in the same manner as during the first reset period Prst1.

Specifically, the first gate line drive circuit 15a supplies the gate drive signal Vgcl(1) at the high-level voltage (power supply voltage VDD) to the first gate line GCL1(1) during a row read period VR(1). The control circuit 122 sequentially supplies the selection signals ASW1, . . . , ASW6 to the signal line selection circuit 16 during a period in which the gate drive signal Vgcl(1) is at the high-level voltage (power supply voltage VDD). This operation sequentially electrically couples the signal lines SGL of the partial detection areas PAA selected by the gate drive signal Vgcl(1) to the detection circuit 48. As a result, the detection signal Vdet for each of the partial detection areas PAA is supplied to the detection circuit 48.

In the same manner, the first gate line drive circuit 15a supplies the gate drive signals Vgcl(2), . . . , Vgcl(M−1), Vgcl(M) at the high-level voltage to the first gate lines GCL1(2), . . . , GCL1(M−1), GCL1(M) during row read periods VR(2), . . . , VR(M−1), VR(M), respectively. That is, the first gate line drive circuit 15a supplies the gate drive signal Vgcl to the first gate line GCL1 during each of the row read periods VR(1), VR(2), . . . , VR(M−1), VR(M). The signal line selection circuit 16 sequentially selects the signal lines SGL based on the selection signal ASW during each period in which the gate drive signal Vgcl is set to the high-level voltage. The signal line selection circuit 16 sequentially electrically couples each of the signal lines SGL to one detection circuit 48. Thus, the detection device 1 can output the detection signals Vdet of all the partial detection areas PAA to the detection circuit 48 during the read period Pdet.

In the present embodiment, the gate drive signal Vgcl is supplied to the first gate lines GCL1 row by row, and the first switching elements Tr1 belonging to a predetermined row are brought into a coupled state. Specifically, as illustrated in FIG. 7, the gate line drive circuit 15 supplies the gate drive signal Vgcl(1) at the high-level voltage (power supply voltage VDD) to the first gate line GCL1(1) at time t21. The row read period VR(1) starts at time t21 when the gate drive signal Vgcl(1) is set to the high-level voltage.

Specifically, the control circuit 122 sequentially supplies the selection signals ASW1, . . . , ASW6 to the signal line selection circuit 16 during a period in which the gate drive signal Vgcl(1) is at the high-level voltage (power supply voltage VDD). The third switching elements Tr3 are sequentially brought into the coupled state according to the selection signals ASW1, . . . , ASW6. That is, during the period of reading each row (row read period VR(1)), the first switching elements Tr1 of the predetermined row are in the coupled state, and the signal line selection circuit 16 electrically couples the signal lines SGL to the detection circuit 48 column by column in a predetermined order. As a result, the detection signal Vdet for each of the partial detection areas PAA is supplied to the detection circuit 48.

In FIG. 7, the selection signals ASW1, . . . , ASW6 are supplied in the order of periods T11, . . . , T16 in a time-division manner. The control circuit 122 sets the selection signal ASW6 to the low-level voltage, and the reading of the last column ends. Thus, the row read period VR(1) ends.

In the present embodiment, after the completion of the read period of the predetermined row (row read period VR(1)), a forward bias is applied to the optical sensors PD corresponding to the gate line GCL(1) before the reference potential COM is supplied to the optical sensors PD corresponding to the gate line GCL(1) and the signal lines SGL. Specifically, after the end of the row read period VR(1), the first gate line drive circuit 15a sets the gate drive signal Vgcl(1) to the low-level voltage (power supply voltage VSS), and the second gate line drive circuit 15b sets the refreshing signal RST3 to the high-level voltage at time t22. As a result, the first switching elements Tr1 are turned off; the fourth switching elements Tr4 are turned on; the forward bias potential RF is supplied to the optical sensors PD corresponding to the gate line GCL(1) and the signal lines SGL; and a forward bias of 0.75 V is applied between the cathodes and the anodes of the optical sensors PD.

Then, the second gate line drive circuit 15b sets the refreshing signal RST3 to the low-level voltage at time t23. This operation turns off the fourth switching elements Tr4. Hereinafter, the period from time t22 to time t23 is referred to as "refreshing period Pref" in the first embodiment.

After the refreshing period Pref of the predetermined row and before the start of the read period of the next row (row read period VR(2)), the reference potential COM is supplied to the optical sensors PD belonging to the predetermined row and the signal lines SGL. Specifically, the first gate line drive circuit 15a sets the gate drive signal Vgcl(1) to the high-level voltage after the end of the refreshing period Pref, and the control circuit 122 sets the second reset signal RST2 to the high-level voltage at time t24. As a result, the fourth switching elements Tr4 are turned off; the first switching elements Tr1 and the third switching elements Tr3 are turned on; and the optical sensors PD corresponding to the gate line GCL(1) and the signal lines SGL are supplied with the reference potential COM.

In FIG. 7, the second reset signal RST2 is set to the high-level voltage at time t24 after the end of the refreshing period Pref. However, in an aspect, the second reset signal RST2 may be set to the high-level voltage at time t22 when the refreshing signal RST3 is set to the high-level voltage, as illustrated with a dashed line in FIG. 7.

Then, at time t25, the first gate line drive circuit 15a sets the gate drive signal Vgcl(1) to the low-level voltage. This operation brings the first switching elements Tr1 of the predetermined row into a non-coupled state. At time t25, the control circuit 122 sets the second reset signal RST2 to the low-level voltage. This operation ends the read period Pdet of the first row. Hereinafter, the period from time t24 to time t25 is referred to as "second reset period Prst2" in the first embodiment.

Then, the first gate line drive circuit 15a supplies the gate drive signal Vgcl(2) at the high-level voltage (power supply voltage VDD) to the first gate line GCL1(2) in the second row at time t26. Subsequently, in the same manner as in the first row, the read period Pdet of the second row is executed from time t26 to time t30. The detection for one frame can be performed by repeating the operation described above to the last row (gate line GCL(256)).

Figure 8:
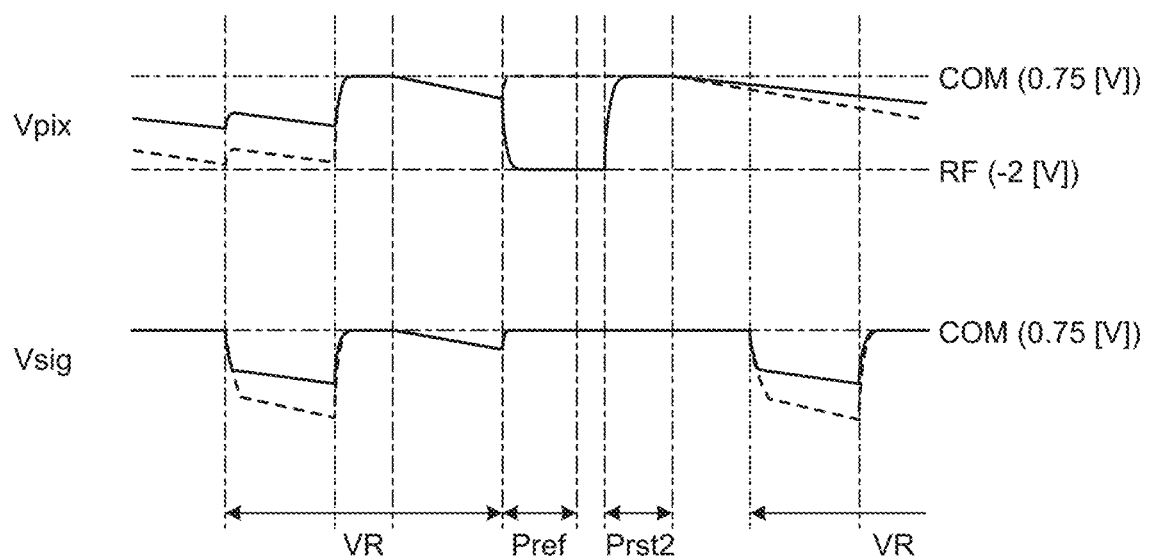
FIG. 8 is a waveform chart illustrating examples of variations in cathode potential and signal line potential of the optical sensor during the read period of the detection device according to the first embodiment.

FIG. 8 is a waveform chart illustrating examples of variations in cathode potential and signal line potential of the optical sensor during the read period of the detection device according to the first embodiment. In FIG. 8, solid lines illustrate variations of a cathode potential Vpix and a signal line potential Vsig of the optical sensor PD in the first embodiment, and dashed lines illustrate the variations of the cathode potential Vpix and the signal line potential Vsig when the refreshing period is not provided.

When the refreshing period Pref is not provided before the second reset period Prst2, both the cathode potential Vpix and the signal line potential Vsig of the optical sensor PD greatly vary as illustrated in FIG. 8. In contrast, in the first embodiment, the variations of the cathode potential Vpix and the signal line potential Vsig of the optical sensor PD can be reduced by providing the refreshing period Pref before the second reset period Prst2. In FIG. 8, a space between vertical long dashed short dashed lines in the row read period VR represents a period in which the signal selection circuit 16 reads each column, and FIG. 8 illustrates the read periods for three columns in one row read period VR, as an example. However, the present disclosure is not limited to this example.

Thus, in the first embodiment, the refreshing period Pref is provided before the second reset period Prst2 for each of the row read periods VR. Therefore, the characteristics of the optical sensor PD (OPD) can be restored to the initial state even when variations are present in the organic semiconductor layer where the optical sensor PD is formed. That is, the detection accuracy of the detection device 1 according to the first embodiment can be restrained from decreasing.

First Modification

Figure 9:
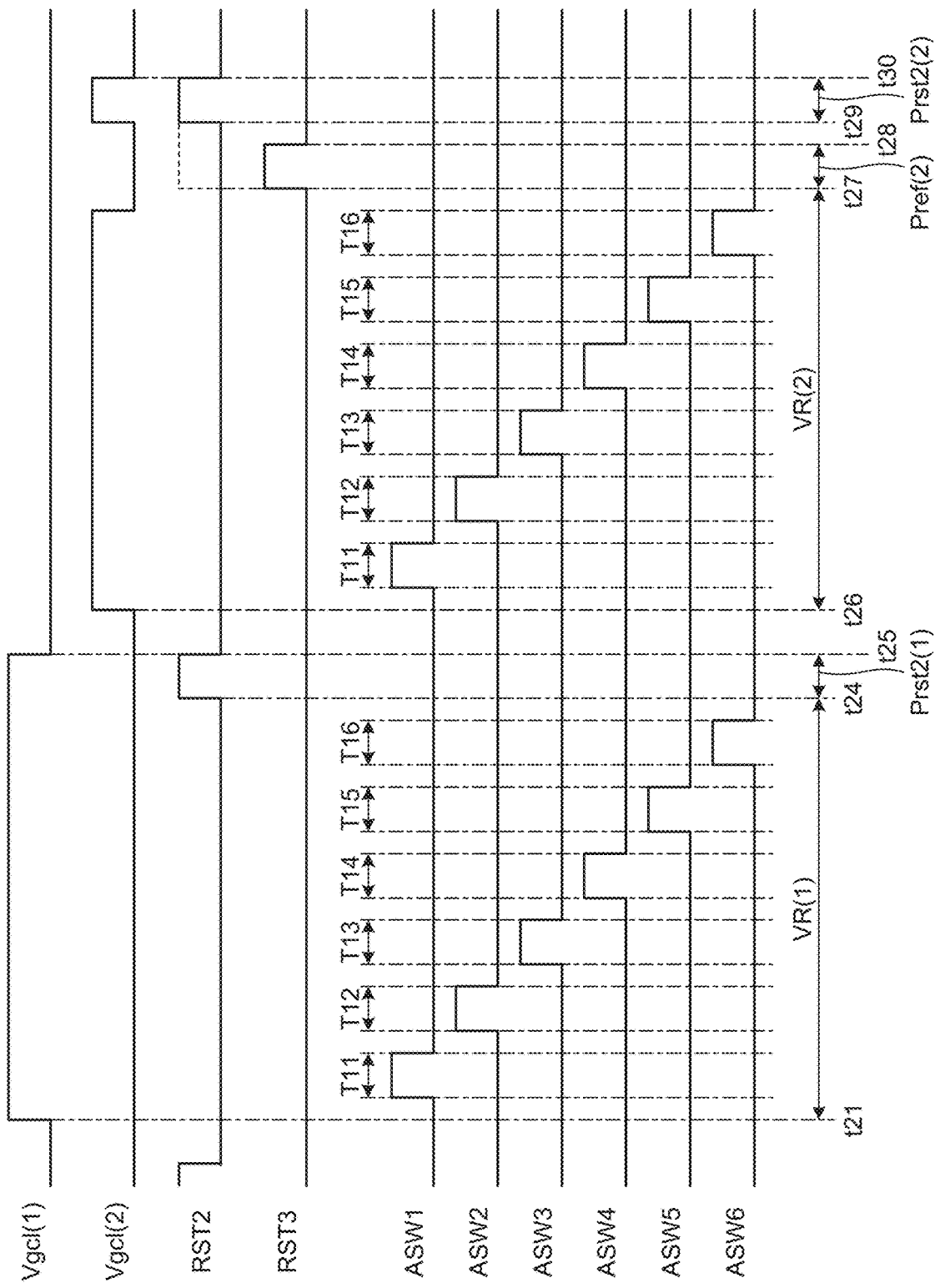
FIG. 9 is a waveform timing chart illustrating an operation example during the read period according to a first modification of the first embodiment.

FIG. 9 is a waveform timing chart illustrating an operation example during the read period according to a first modification of the first embodiment. In the example illustrated in FIG. 7, the refreshing period Pref is provided for each line, but the refreshing period Pref may be provided for each unit of a predetermined number of lines. In the example illustrated in FIG. 9, the second reset period Prst2 is provided without providing the refreshing period Pref after the completion of the row read period VR(1) in the row corresponding to the gate drive signal Vgcl(1). Subsequently, the refreshing period Pref and the second reset period Prst2 are provided after the completion of the row read period VR(2) in a row corresponding to the gate drive signal Vgcl(2) adjacent to the gate drive signal Vgcl(1).

Second Modification

Figure 10:
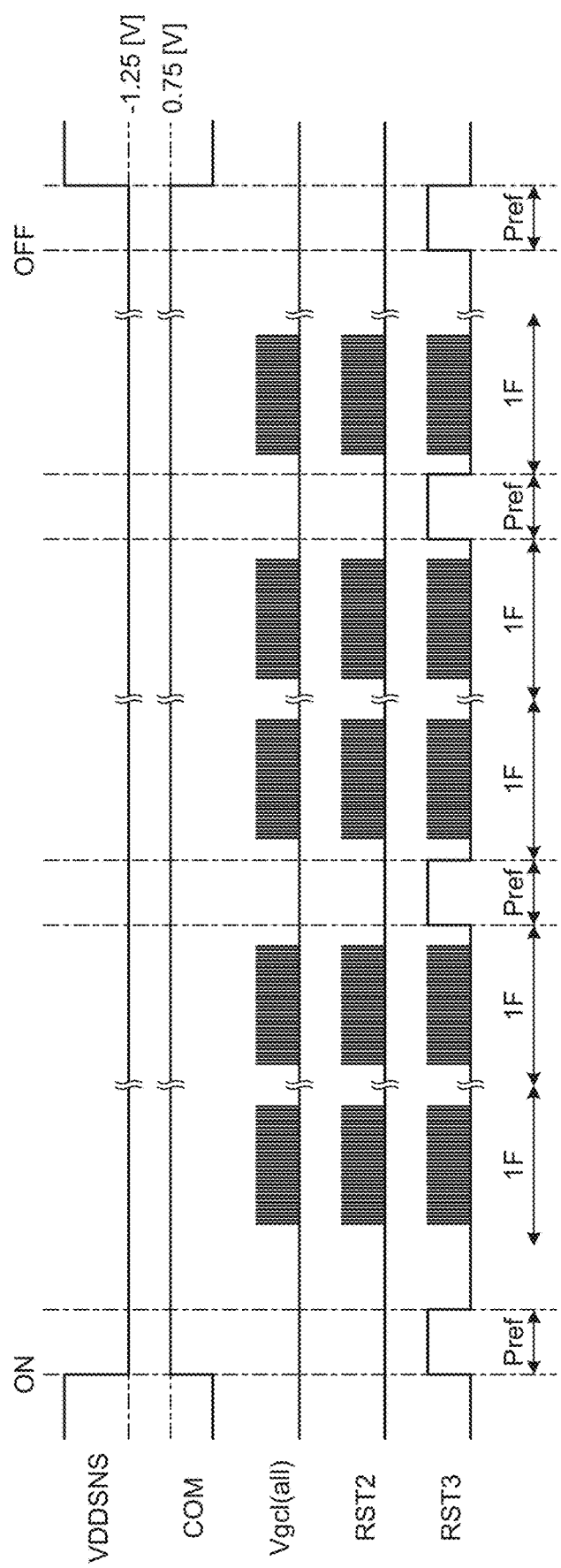
FIG. 10 is a diagram illustrating an example of refreshing operation timing of the detection device according to a second modification of the first embodiment.

FIG. 10 is a diagram illustrating an example of refreshing operation timing of the detection device according to a second modification of the first embodiment. In the first embodiment and the first modification, the examples have been illustrated in which the refreshing period Pref is provided in the read period Pdet. However, for example, in an aspect, the refreshing period Pref may be collectively provided for each unit of a predetermined number of frames, as illustrated in FIG. 10. Alternatively, for example, in an aspect, the refreshing period Pref may be provided in an on-sequence of the detection circuit 48, that is, before the start of the normal detection operation of the detection circuit 48, as illustrated in FIG. 10. Further alternatively, for example, in an aspect, the refreshing period Pref may be provided in an off-sequence of the detection circuit 48, that is, after the completion of the normal detection operation of the detection circuit 48, as illustrated in FIG. 10.

Specifically, for example, the second gate line drive circuit 15b sets the refreshing signal RST3 to the high-level voltage for each unit of the predetermined number of frames. This operation can provide the refreshing period Pref in which the forward bias of 0.75 V is applied between the cathodes and the anodes of the optical sensors PD.

Specifically, for example, the second gate line drive circuit 15b sets the refreshing signal RST3 to the high-level voltage before the start of the normal detection operation of the detection circuit 48. In this case, the gate drive signals Vgcl(1), . . . , Vgcl(M) may be set to the high-level voltage, and the refreshing signals RST3 corresponding to the second gate lines GCL2 may be set to the high-level voltage. This operation can provide the refreshing period Pref in which the forward bias of 0.75 V is applied between the cathodes and the anodes of the optical sensors PD.

Specifically, for example, the second gate line drive circuit 15b sets the refreshing signal RST3 to the high-level voltage after the completion of the normal detection operation of the detection circuit 48. In this case, the gate drive signals Vgcl(1), . . . , Vgcl(M) may be set to the high-level voltage, and the refreshing signals RST3 corresponding to the second gate lines GCL2 may be set to the high-level voltage. This operation can provide the refreshing period Pref in which the forward bias of 0.75 V is applied between the cathodes and the anodes of the optical sensors PD.

Thus, by providing the refreshing period Pref in one or more of the following ways: for each unit of a predetermined number of frames, in the on-sequence of the detection circuit 48, and in the off-sequence of the detection circuit 48, the characteristics of the optical sensor PD (OPD) can be restored to the initial state even when variations are present in the organic semiconductor layer where the optical sensor PD is formed. That is, the detection accuracy of the detection device 1 according to the first embodiment can be restrained from decreasing.

Second Embodiment

Figure 11:
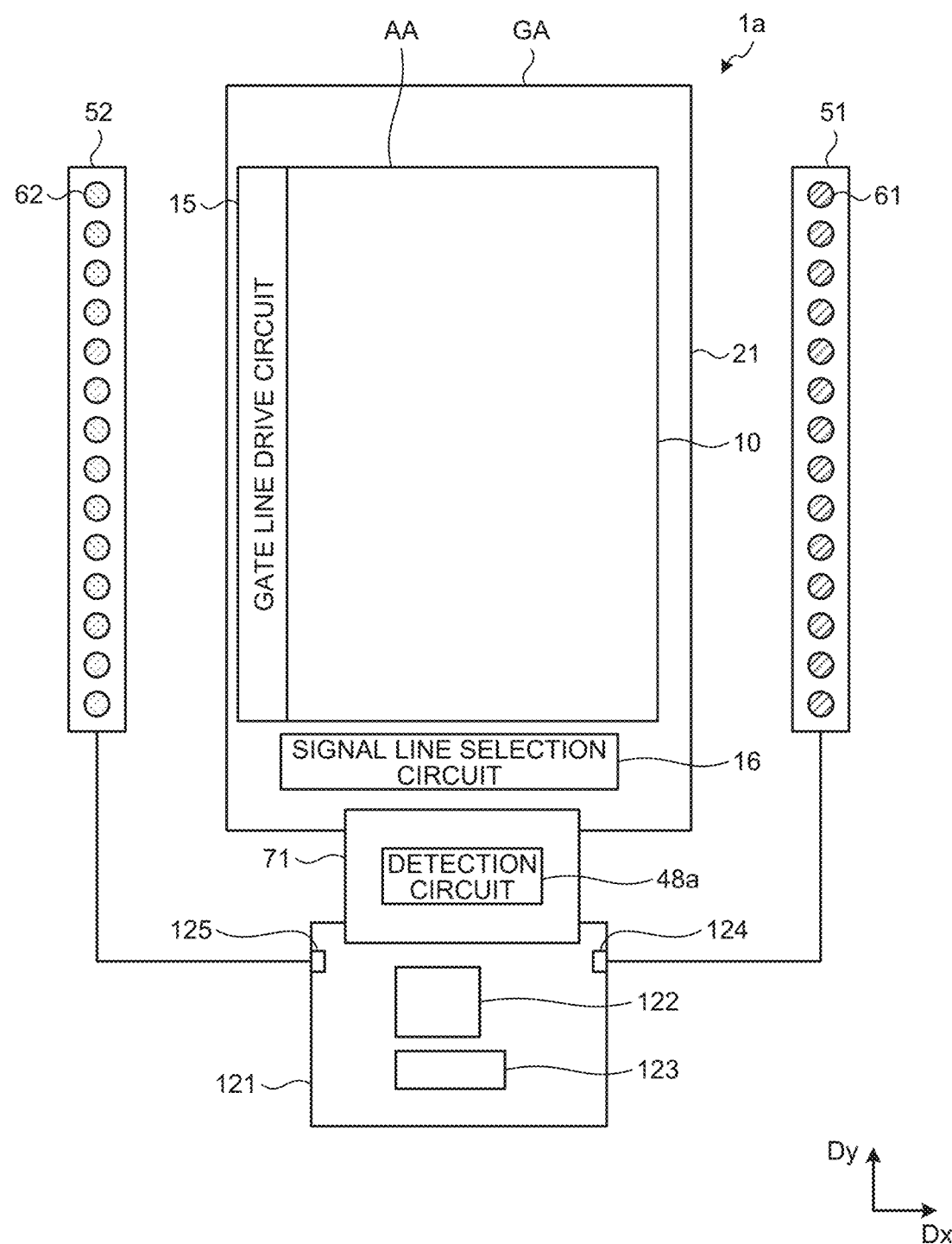
FIG. 11 is a plan view illustrating a detection device according to a second embodiment of the present disclosure.
Figure 12:
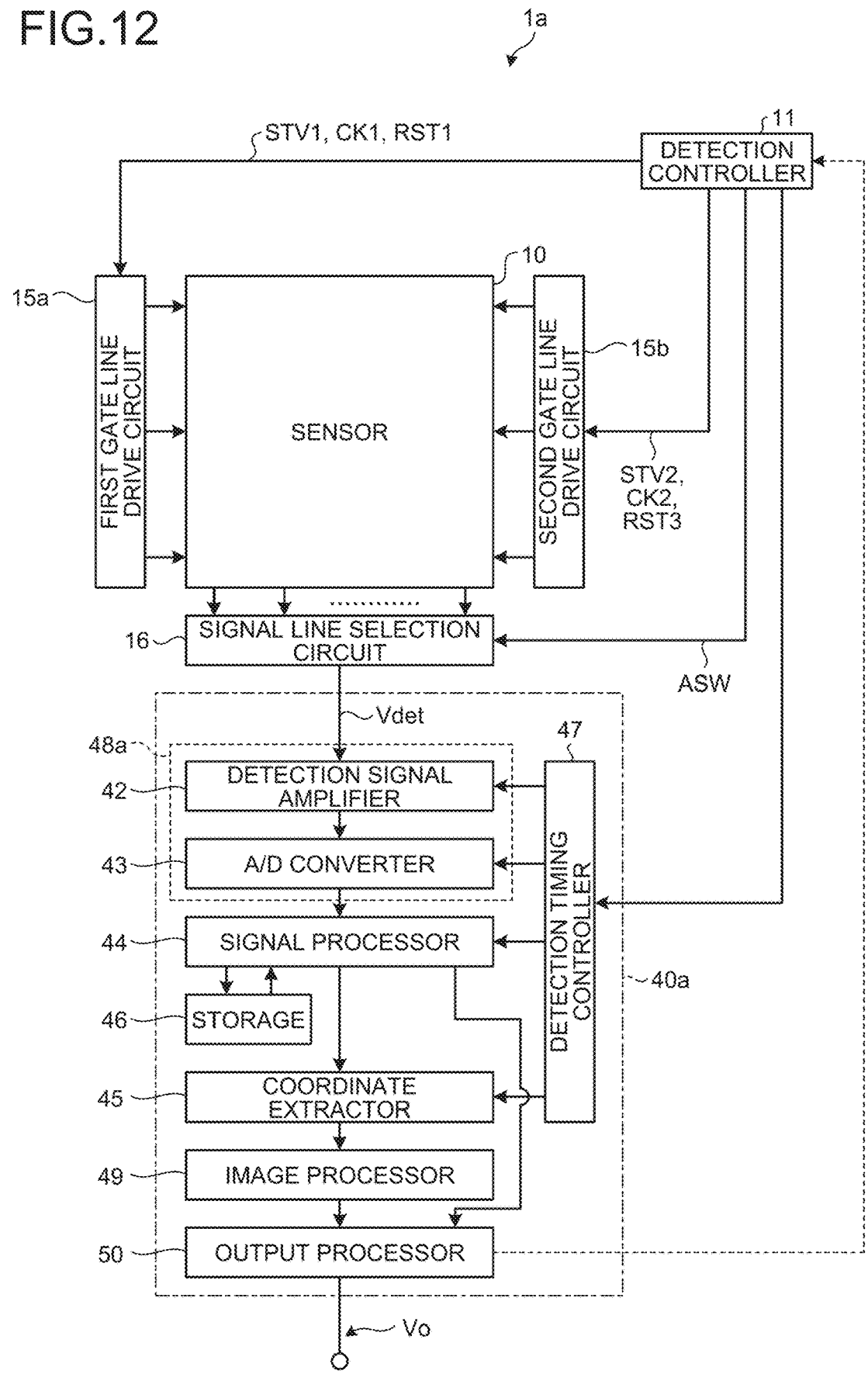
FIG. 12 is a block diagram illustrating a configuration example of the detection device according to the second embodiment.
Figure 13:
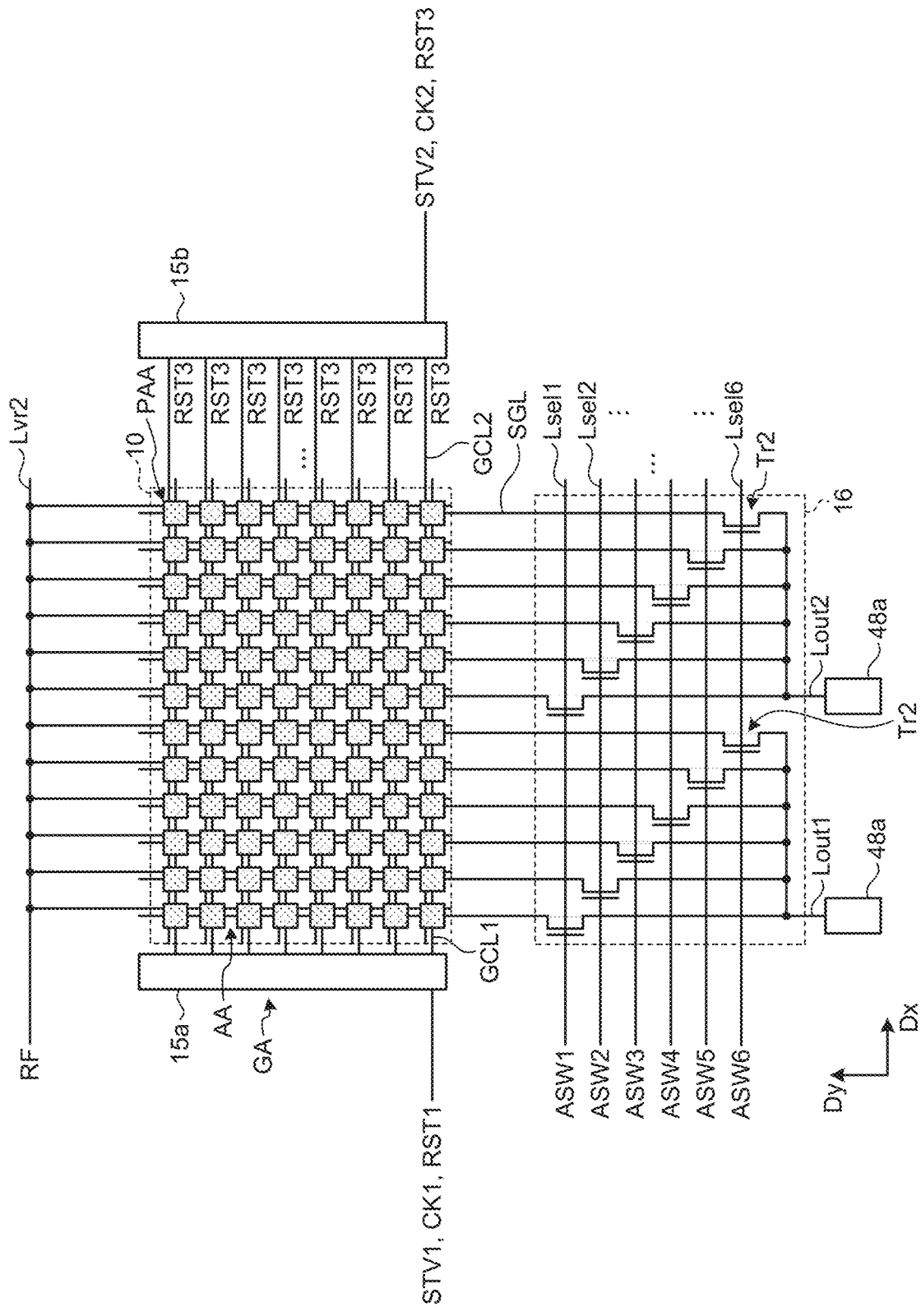
FIG. 13 is a circuit diagram illustrating the detection device according to the second embodiment.
Figure 14:
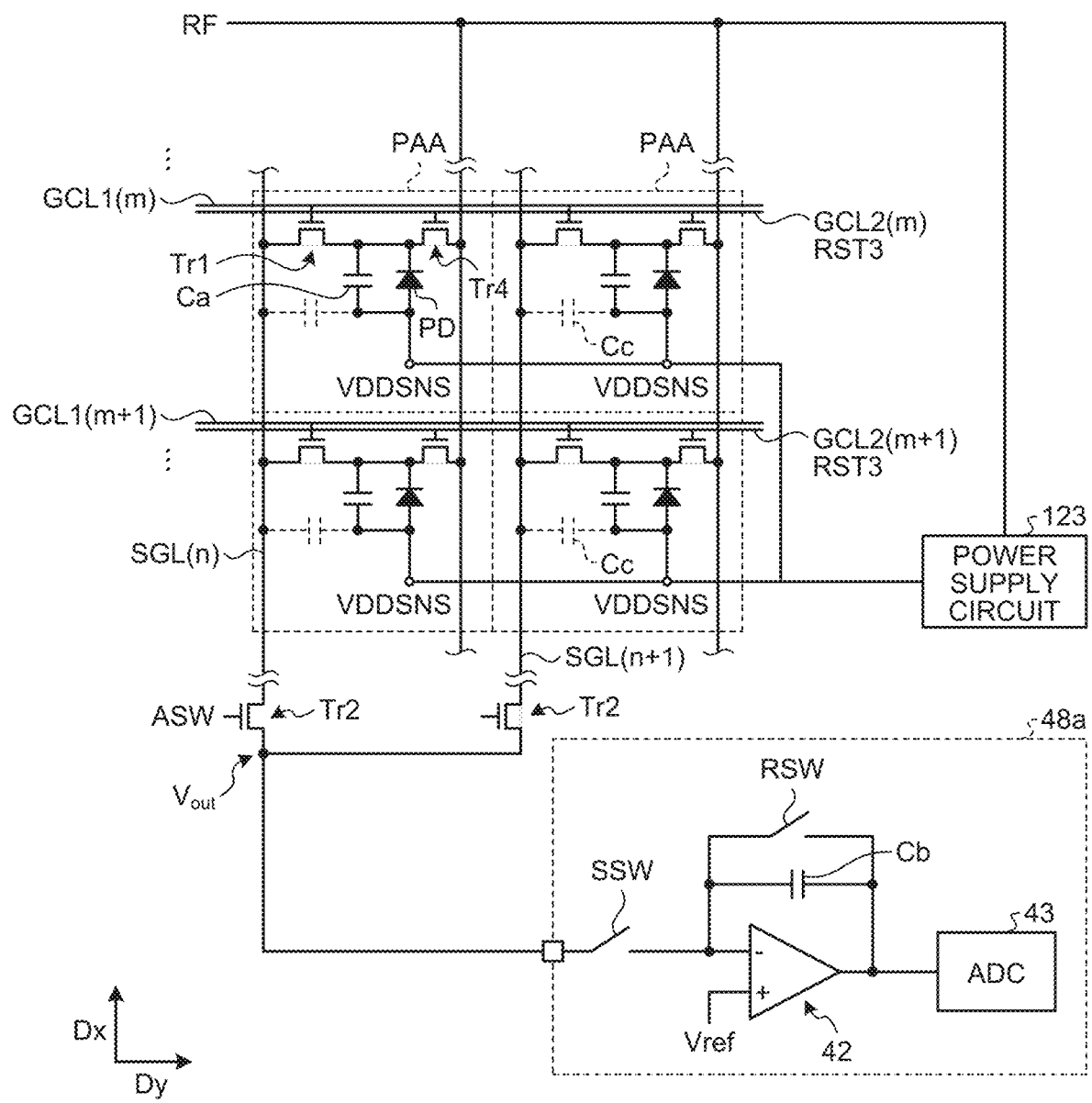
FIG. 14 is a circuit diagram illustrating the partial detection areas of the detection device according to the second embodiment.
Figure 15:
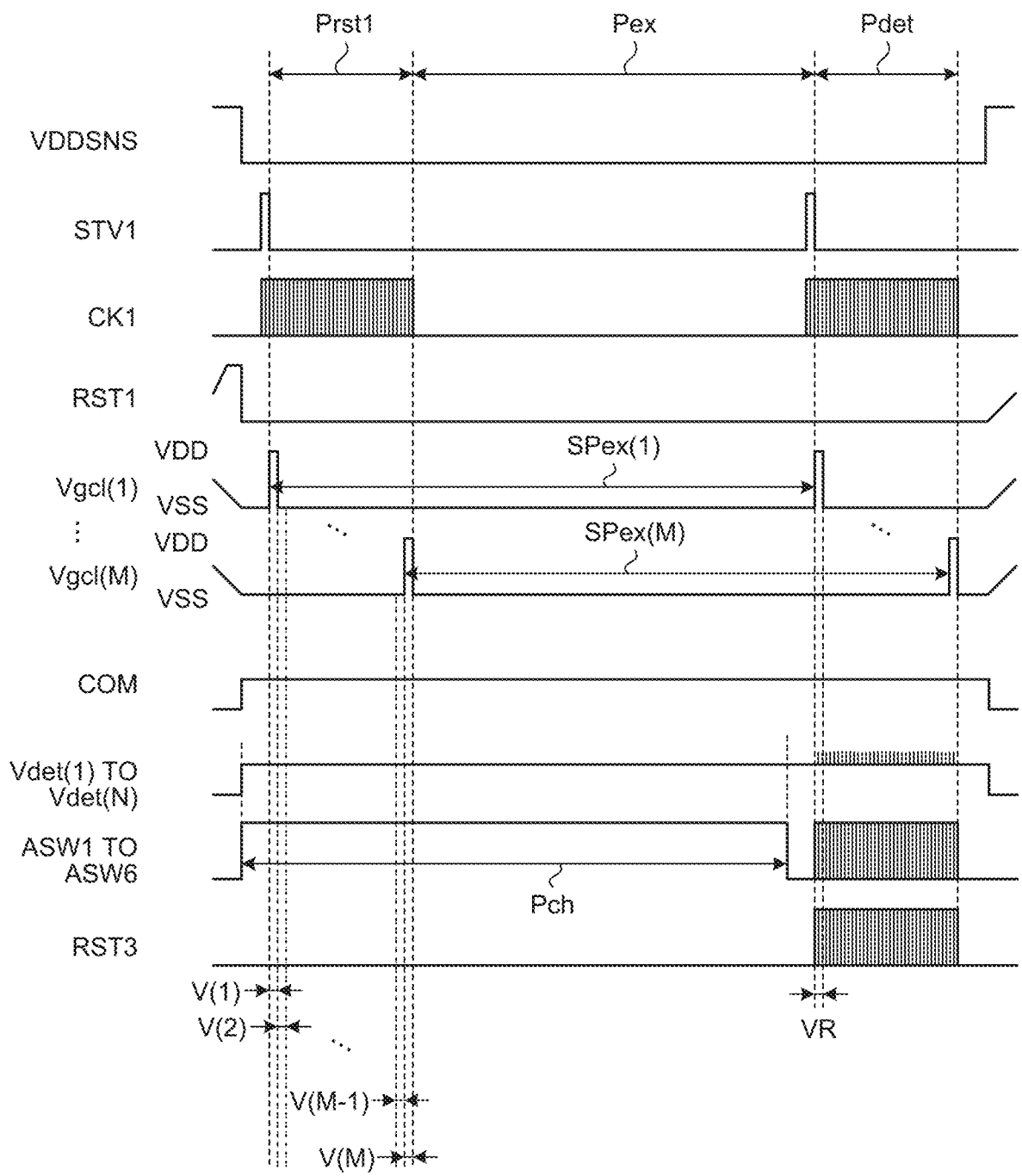
FIG. 15 is a waveform timing chart illustrating an operation example of the detection device according to the second embodiment.
Figure 16:
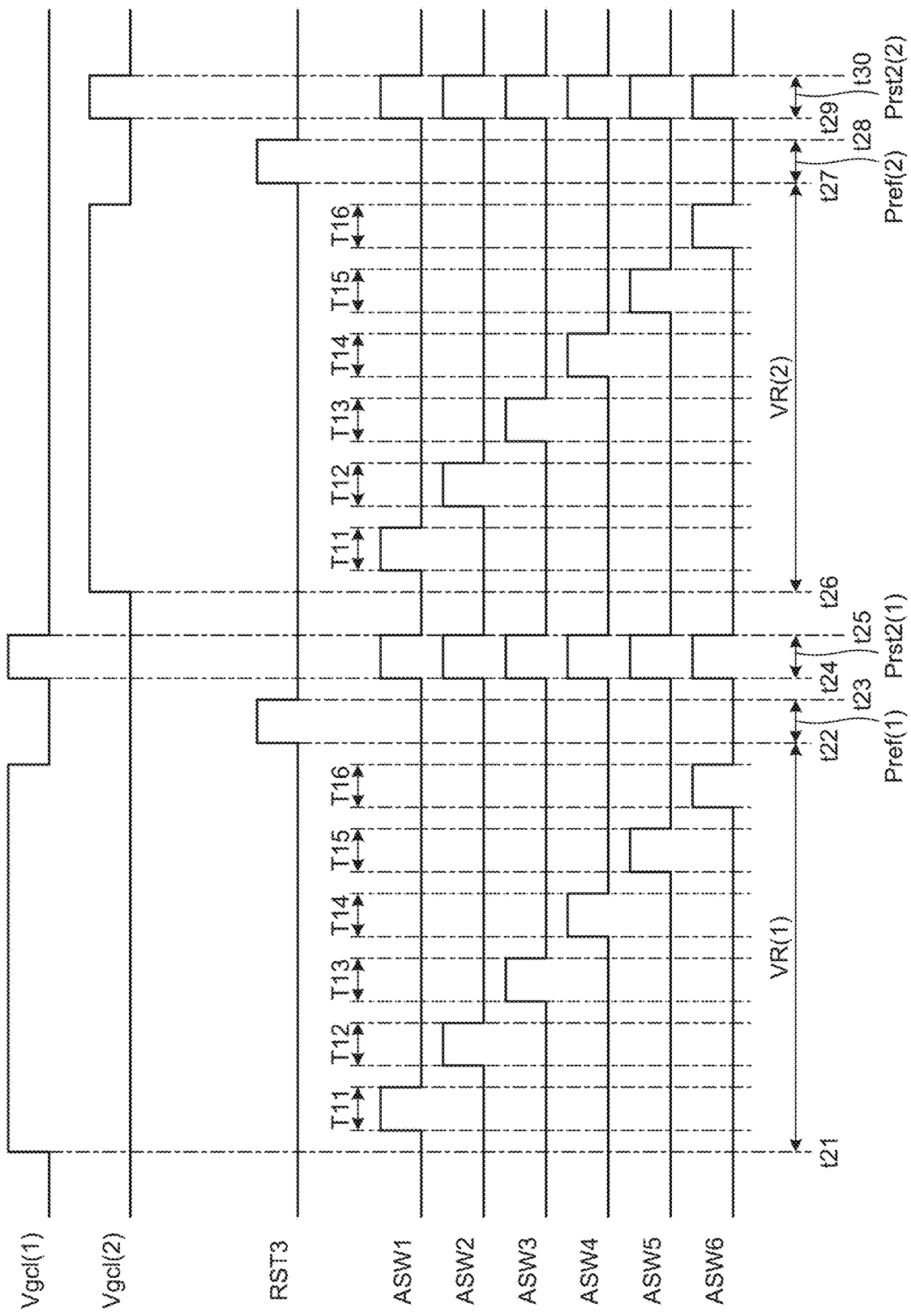
FIG. 16 is a waveform timing chart illustrating an operation example during the read period of the detection device according to the second embodiment.

FIG. 11 is a plan view illustrating a detection device according to a second embodiment of the present disclosure. FIG. 12 is a block diagram illustrating a configuration example of the detection device according to the second embodiment. FIG. 13 is a circuit diagram illustrating the detection device according to the second embodiment. FIG. 14 is a circuit diagram illustrating the partial detection areas of the detection device according to the second embodiment. FIG. 15 is a waveform timing chart illustrating an operation example of the detection device according to the second embodiment. FIG. 16 is a waveform timing chart illustrating an operation example during the read period of the detection device according to the second embodiment. In the following description, the same components as those described in the first embodiment described above are denoted by the same reference signs, and the description thereof will not be repeated.

As illustrated in FIGS. 11 to 14, a detection device 1a according to the second embodiment does not include a component corresponding to the reset circuit 17 of the first embodiment. Therefore, in the second reset period Prst2, each of the signal lines SGL is supplied with the reference potential COM from a detection circuit 48a of a detector 40a as illustrated in FIG. 16.

In the present embodiment, in the same manner as in the first embodiment, a forward bias is applied to the optical sensors PD corresponding to the gate line GCL(1) during the refreshing period Pref from time t22 to time t23. Specifically, after the end of the row read period VR(1), the first gate line drive circuit 15a sets the gate drive signal Vgcl(1) to the low-level voltage (power supply voltage VSS), and the second gate line drive circuit 15b sets the refreshing signal RST3 to the high-level voltage at time t22. As a result, the first switching elements Tr1 are turned off; the fourth switching elements Tr4 are turned on; the forward bias potential RF serving as the refreshing potential of the optical sensor PD is supplied to the optical sensors PD corresponding to the gate line GCL(1) and the signal lines SGL; and the forward bias of 0.75 V is applied between the cathodes and the anodes of the optical sensors PD.

During the subsequent second reset period Prst2 from time t24 to time t25, the reference potential COM is supplied to the optical sensors PD belonging to the predetermined row and the signal lines SGL. At this time, in the present embodiment, the control circuit 122 supplies the selection signals ASW1, . . . , ASW6 to the signal line selection circuit 16. As a result, the reference potential COM is supplied from the detection circuit 48a to the optical sensors PD corresponding to the gate line GCL(1) and the signal lines SGL. Specifically, by turning on the switch SSW and the reset switch RSW of the detection circuit 48a illustrated in FIG. 14, the reference potential (Vref) is supplied as the reference potential COM according to the virtual short principle.

In also the second embodiment, the refreshing period Pref is provided before the second reset period Prst2 for each of the row read periods VR in the same manner as in the first embodiment. Therefore, the characteristics of the optical sensor PD (OPD) can be restored to the initial state even when variations are present in the organic semiconductor layer where the optical sensor PD is formed. That is, the detection accuracy of the detection device 1a according to the second embodiment can be restrained from decreasing.

First Modification

Figure 17:
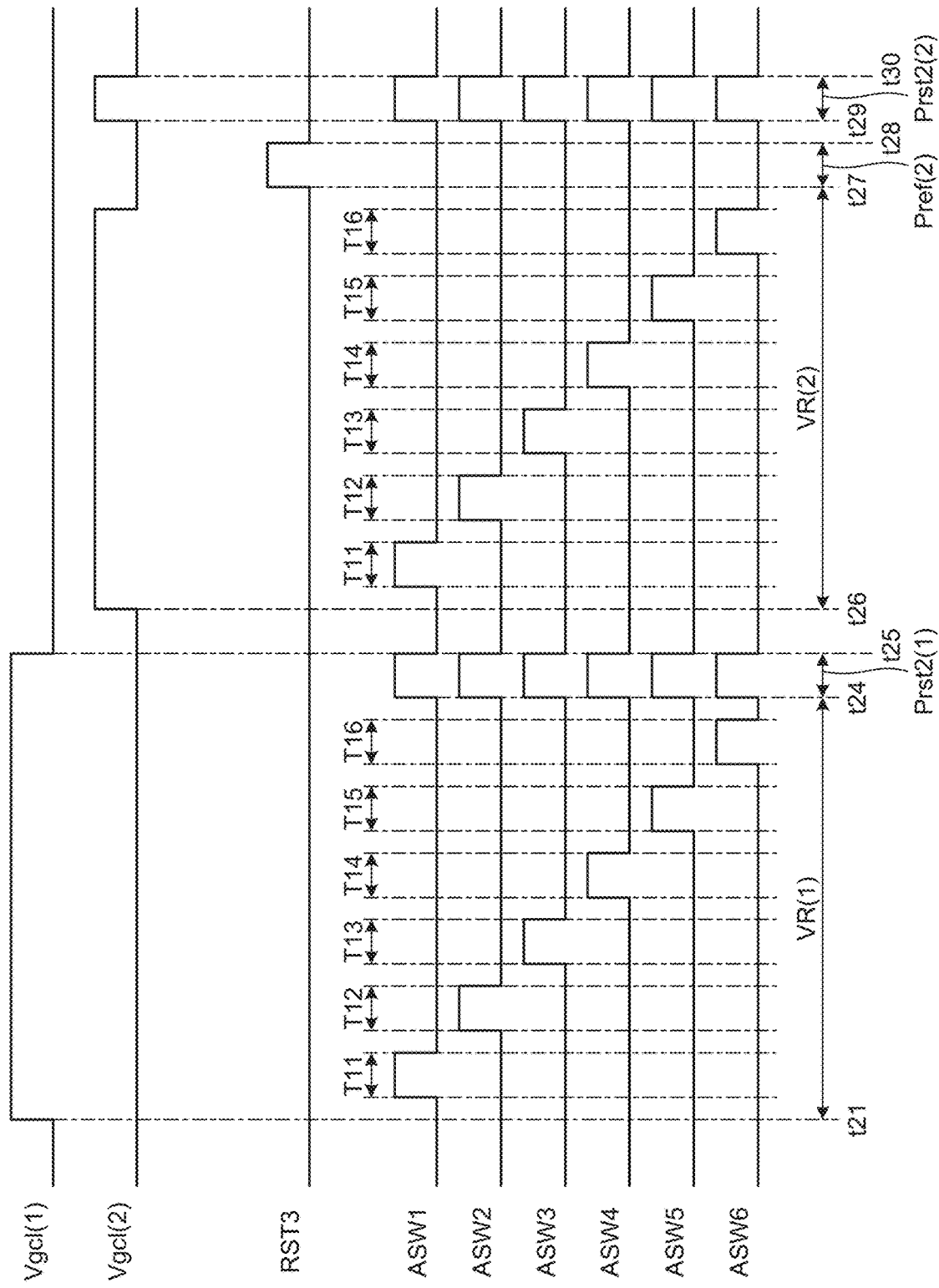
FIG. 17 is a waveform timing chart illustrating an operation example during the read period according to a first modification of the second embodiment.

FIG. 17 is a waveform timing chart illustrating an operation example during the read period according to a first modification of the second embodiment. In also the detection device 1a of the present embodiment, in an aspect, the refreshing period Pref may be provided for each unit of a predetermined number of lines in the same manner as in the first embodiment. In the example illustrated in FIG. 17, the second reset period Prst2 is provided without providing the refreshing period Pref after the completion of the row read period VR(1) in the row corresponding to the gate drive signal Vgcl(1). Subsequently, the refreshing period Pref and the second reset period Prst2 are provided after the completion of the row read period VR(2) in the row corresponding to the gate drive signal Vgcl(2) adjacent to the gate drive signal Vgcl(1).

Second Modification

Figure 18:
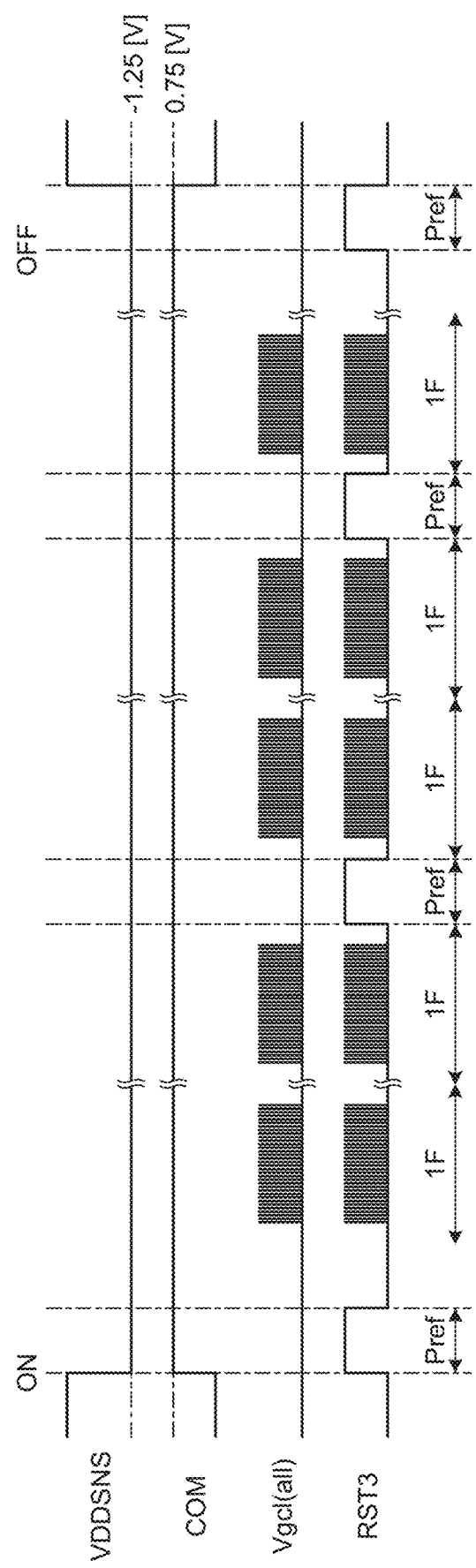
FIG. 18 is a diagram illustrating an example of the refreshing operation timing of the detection device according to a second modification of the second embodiment.

FIG. 18 is a diagram illustrating an example of the refreshing operation timing of the detection device according to a second modification of the second embodiment. In also the detection device 1a according to the present embodiment, for example, in an aspect, the refreshing period Pref may be collectively provided for each unit of a predetermined number of frames in the same manner as in the first embodiment. Alternatively, for example, in an aspect, the refreshing period Pref may be provided in the on-sequence of the detection circuit 48a, that is, before the start of the normal detection operation of the detection circuit 48a, in the same manner as in the first embodiment. Further alternatively, for example, in an aspect, the refreshing period Pref may be provided in the off-sequence of the detection circuit 48a, that is, after the completion of the normal detection operation of the detection circuit 48a, in the same manner as in the first embodiment.

Specifically, for example, the second gate line drive circuit 15b sets the refreshing signal RST3 to the high-level voltage for each unit of the predetermined number of frames. This operation can provide the refreshing period Pref in which the forward bias of 0.75 V is applied between the cathodes and the anodes of the optical sensors PD.

Specifically, for example, before the start of the normal detection operation of the detection circuit 48a, the second gate line drive circuit 15b sets the refreshing signal RST3 to the high-level voltage. In this case, the gate drive signals Vgcl(1), . . . , Vgcl(M) may be set to the high-level voltage, and the refreshing signals RST3 corresponding to the second gate lines GCL2 may be set to the high-level voltage. This operation can provide the refreshing period Pref in which the forward bias of 0.75 V is applied between the cathodes and the anodes of the optical sensors PD.

Specifically, for example, after the completion of the normal detection operation of the detection circuit 48a, the second gate line drive circuit 15b sets the refreshing signal RST3 to the high-level voltage. In this case, the gate drive signals Vgcl(1), . . . , Vgcl(M) may be set to the high-level voltage, and the refreshing signals RST3 corresponding to the second gate lines GCL2 may be set to the high-level voltage. This operation can provide the refreshing period Pref in which the forward bias of 0.75 V is applied between the cathodes and the anodes of the optical sensors PD.

Thus, by providing the refreshing period Pref in one or more of the following ways: for each unit of a predetermined number of frames, in the on-sequence of the detection circuit 48a, and in the off-sequence of the detection circuit 48a, the characteristics of the optical sensor PD (OPD) can be restored to the initial state even when variations are present in the organic semiconductor layer where the optical sensor PD is formed. That is, the detection accuracy of the detection device 1a according to the second embodiment can be restrained from decreasing.

Third Embodiment

Figure 19:
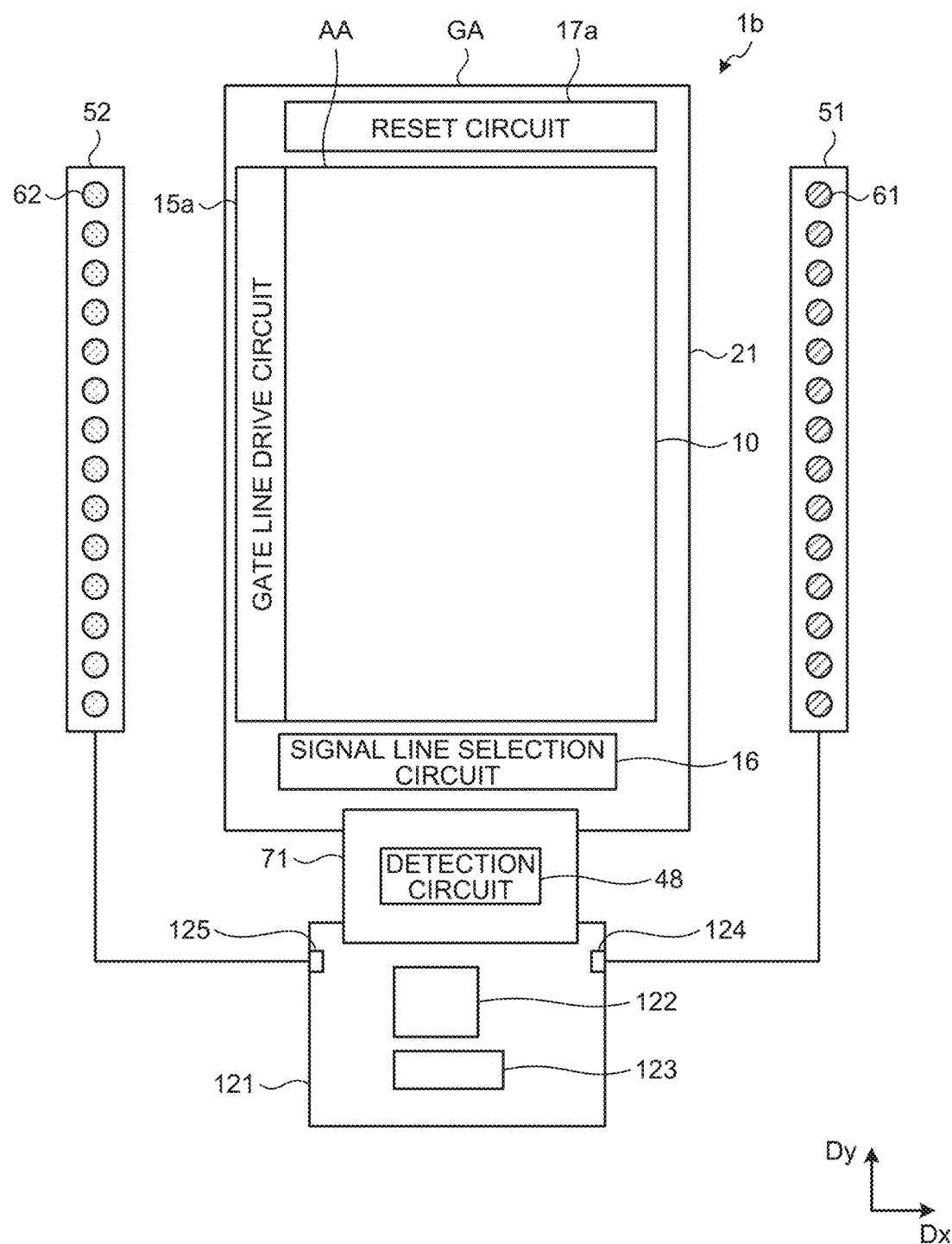
FIG. 19 is a plan view illustrating a detection device according to a third embodiment of the present disclosure.
Figure 20:
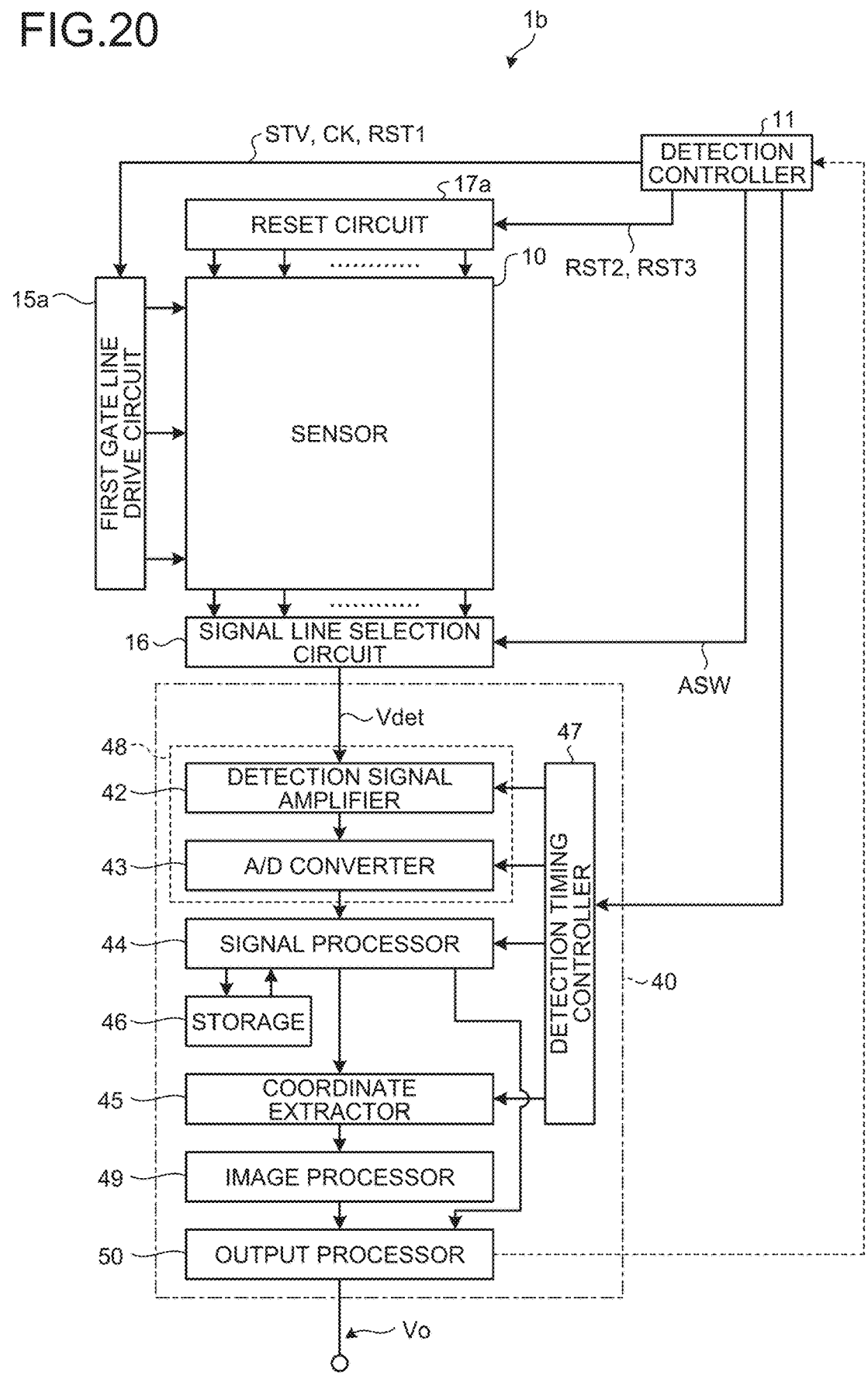
FIG. 20 is a block diagram illustrating a configuration example of the detection device according to the third embodiment.
Figure 21:
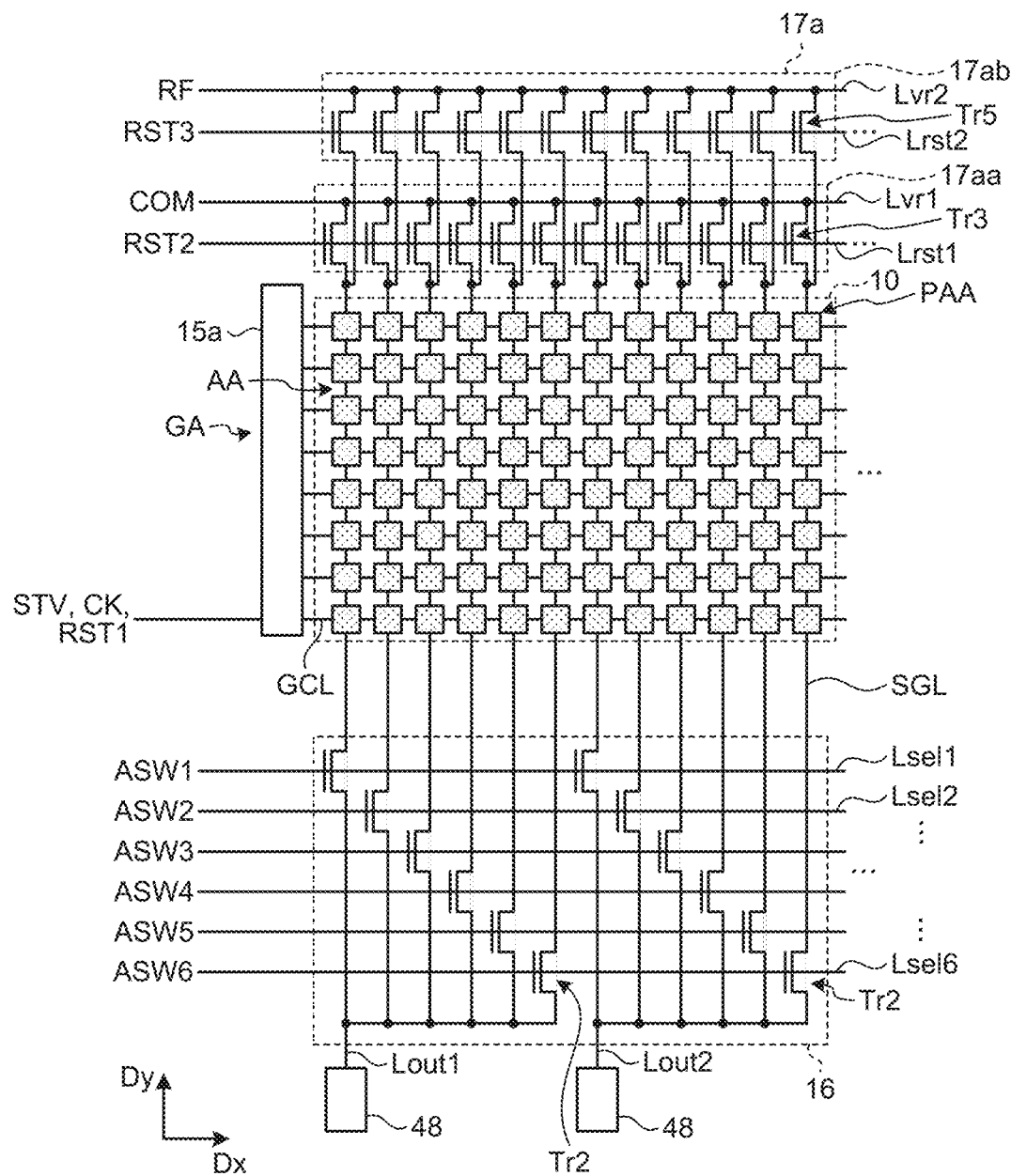
FIG. 21 is a circuit diagram illustrating the detection device according to the third embodiment.
Figure 22:
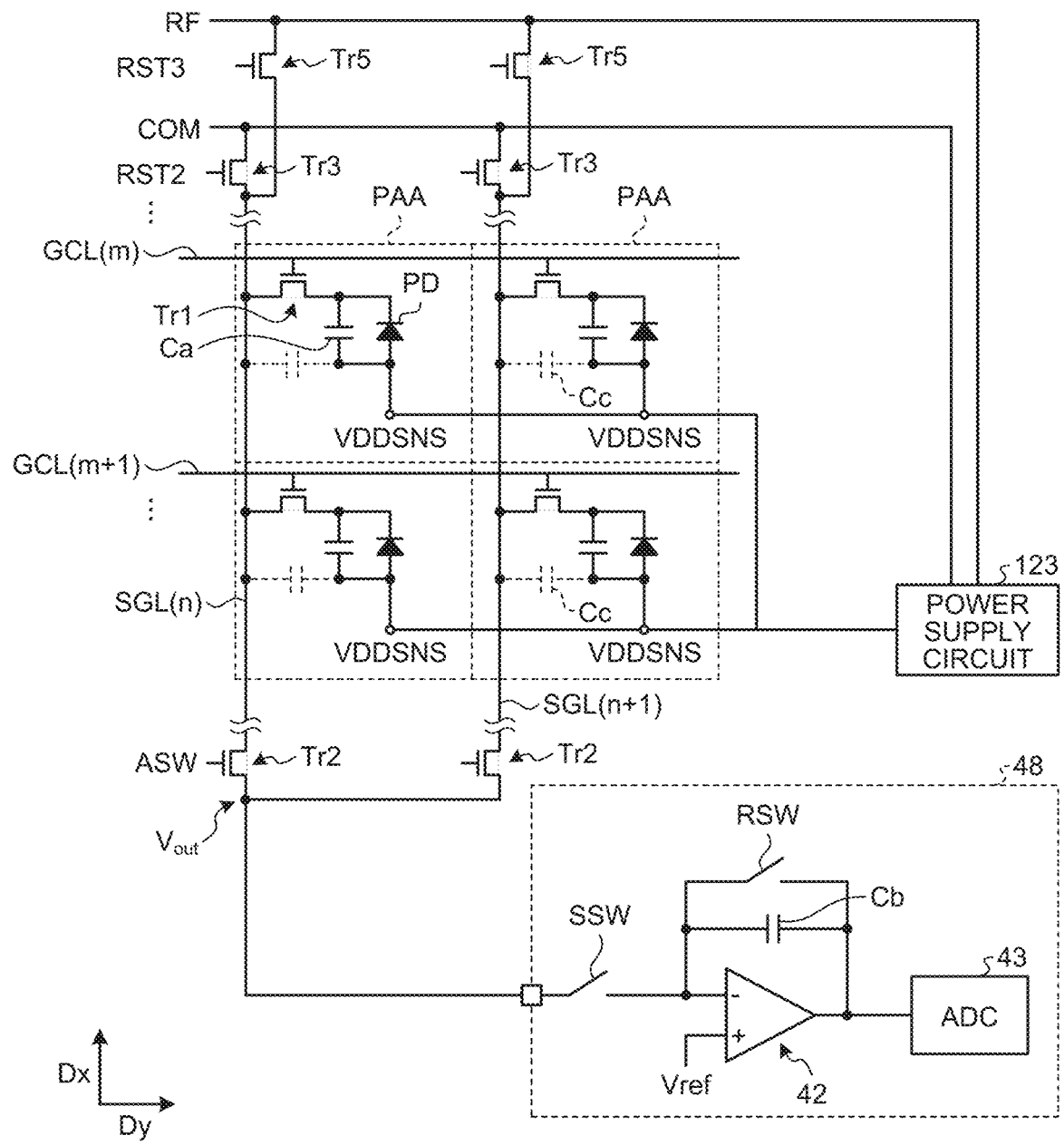
FIG. 22 is a circuit diagram illustrating the partial detection areas of the detection device according to the third embodiment.
Figure 23:
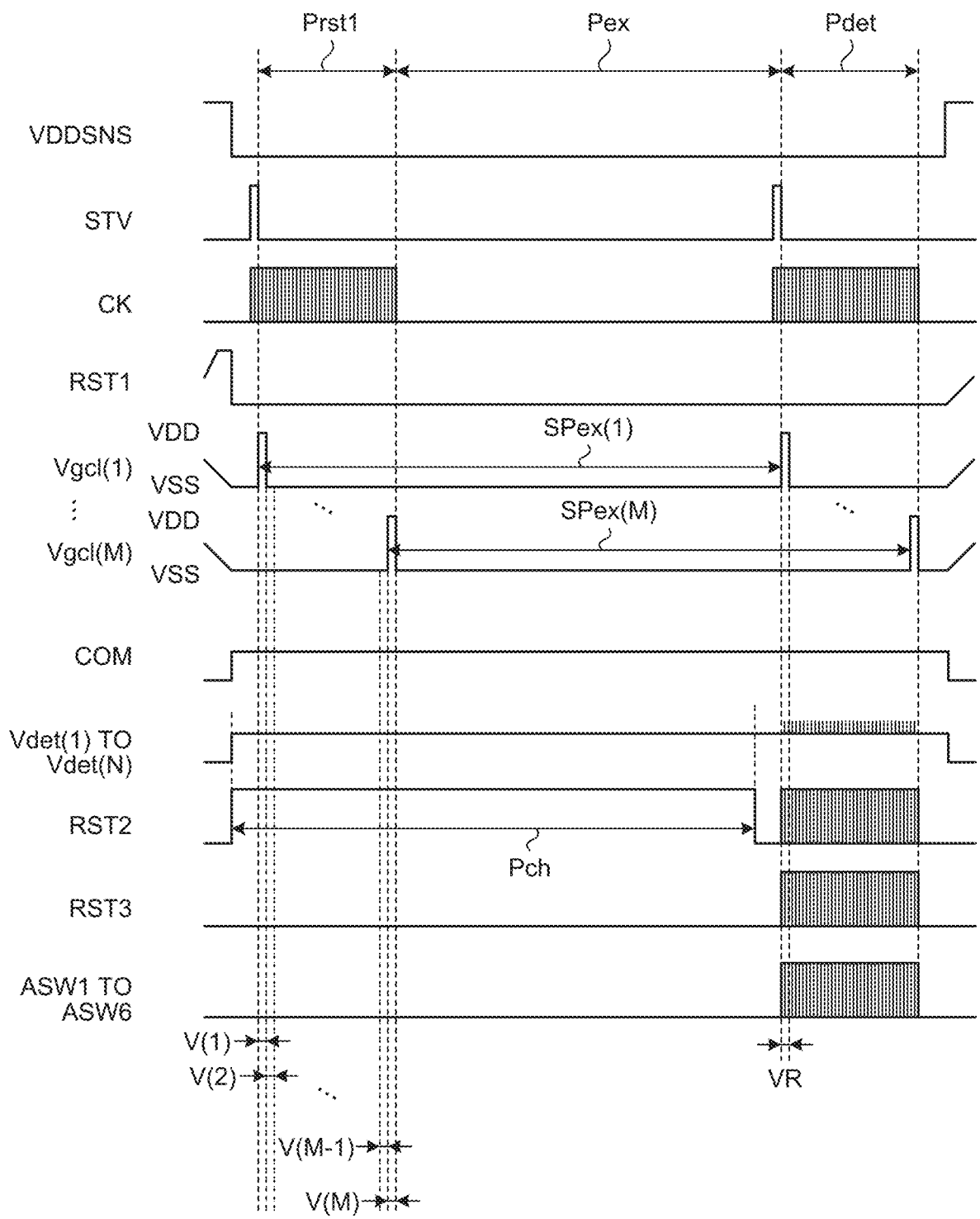
FIG. 23 is a waveform timing chart illustrating an operation example of the detection device according to the third embodiment.
Figure 24:
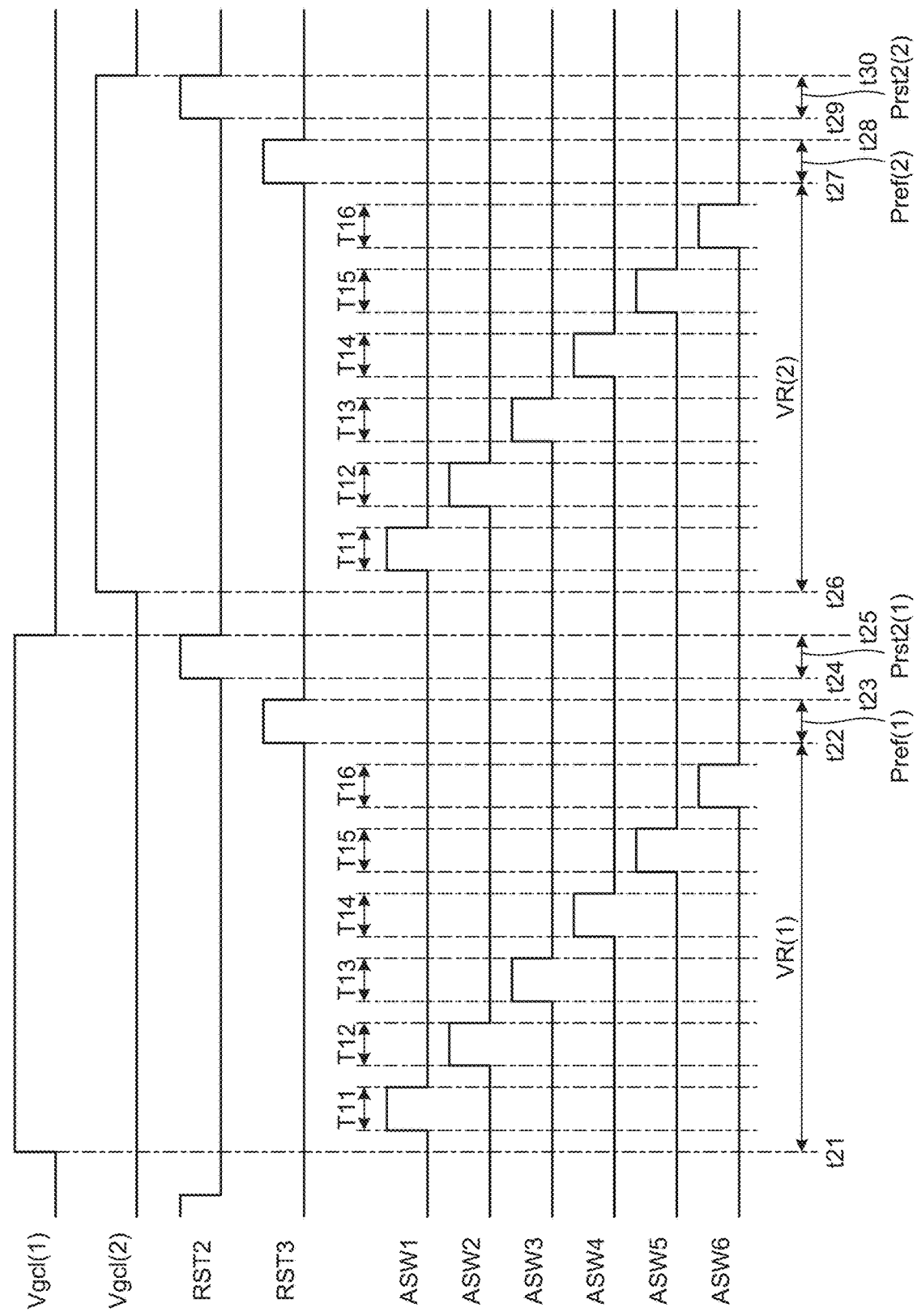
FIG. 24 is a waveform timing chart illustrating an operation example during the read period of the detection device according to the third embodiment.

FIG. 19 is a plan view illustrating a detection device according to a third embodiment of the present disclosure. FIG. 20 is a block diagram illustrating a configuration example of the detection device according to the third embodiment. FIG. 21 is a circuit diagram illustrating the detection device according to the third embodiment. FIG. 22 is a circuit diagram illustrating the partial detection areas of the detection device according to the third embodiment. FIG. 23 is a waveform timing chart illustrating an operation example of the detection device according to the third embodiment. FIG. 24 is a waveform timing chart illustrating an operation example during the read period of the detection device according to the third embodiment. In the following description, the same components as those described in any of the above-described embodiments are denoted by the same reference signs, and the description thereof will not be repeated.

As illustrated in FIGS. 19 to 22, a detection device 1b according to the third embodiment does not include a component corresponding to the second gate line drive circuit 15b of each of the embodiments described above. As illustrated in FIGS. 19 to 22, in the detection device 1b according to the third embodiment, a reset circuit 17a includes a first reset circuit 17aa and a second reset circuit 17ab.

The first reset circuit 17aa corresponds to the reset circuit 17 of each of the embodiments described above. Specifically, the first reset circuit 17aa includes the reference potential line Lvr1, a first reset signal line Lrst1, and the third switching elements Tr3, as illustrated in FIG. 21. The third switching elements Tr3 are provided correspondingly to the signal lines SGL. The reference potential line Lvr1 is coupled to either the sources or drains of the third switching elements Tr3. The first reset signal line Lrst1 is coupled to the gates of the third switching elements Tr3.

As illustrated in FIG. 21, the second reset circuit 17ab includes the forward bias potential line Lvr2, a second reset signal line Lrst2, and fifth switching elements Tr5. The fifth switching elements Tr5 are provided correspondingly to the signal lines SGL. The forward bias potential line Lvr2 is coupled to either the sources or the drains of the fifth switching elements Tr5. The second reset signal line Lrst2 is coupled to the gates of the fifth switching elements Tr5.

As illustrated in FIG. 22, the detection device 1b according to the third embodiment does not include components corresponding to the fourth switching elements Tr4 of each of the embodiments described above in the partial detection areas PAA. Therefore, during the refreshing period, the signal lines SGL, the cathodes of the optical sensors PD, and the capacitive elements Ca are supplied with the forward bias potential RF serving as the refreshing potential of the optical sensor PD from the power supply circuit 123 through the fifth switching elements Tr5 included in the second reset circuit 17ab, and the forward bias of 0.75 V is applied between the cathodes and the anodes of the optical sensors PD.

In the present embodiment, as illustrated in FIG. 24, the first gate line drive circuit 15a keeps the gate drive signal Vgcl(1) at the high-level voltage during a period until time t25 including the refreshing period Pref from time t22 to time t23, and the control circuit 122 keeps the refreshing signal RST3 at the high-level voltage during the refreshing period Pref from time t22 to time t23. As a result, the fourth switching elements Tr4 are turned on while the first switching elements Tr1 are kept on, and the forward bias potential RF serving as the refreshing potential of the optical sensors PD is supplied to the optical sensors PD corresponding to the gate line GCL(1) and the signal lines SGL.

In also the third embodiment, the refreshing period Pref is provided before the second reset period Prst2 for each of the row read periods VR in the same manner as in the embodiments described above. Therefore, the characteristics of the optical sensor PD (OPD) can be restored to the initial state even when variations are present in the organic semiconductor layer where the optical sensor PD is formed. That is, the detection accuracy of the detection device 1b according to the third embodiment can be restrained from decreasing.

First Modification

Figure 25:
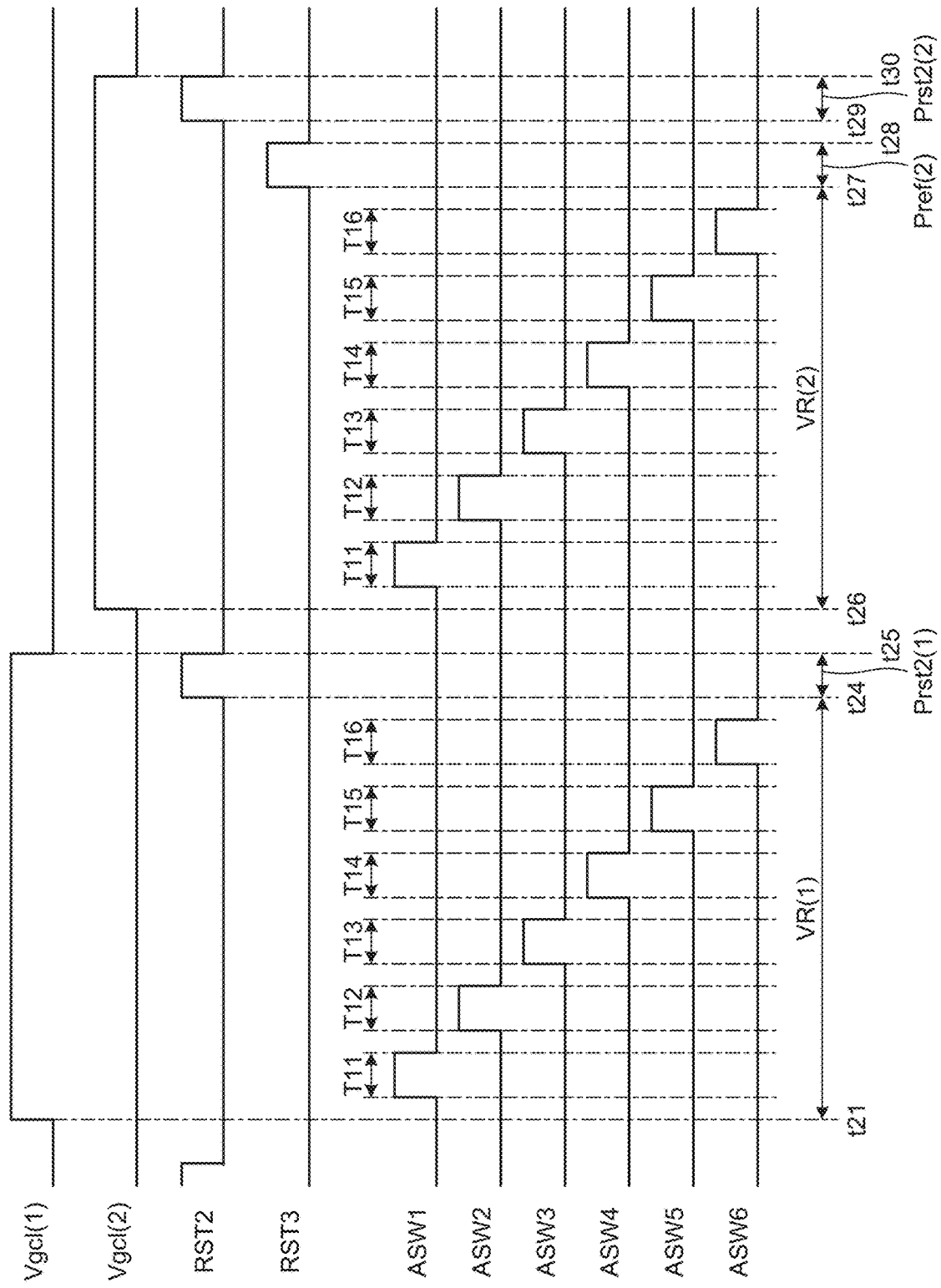
FIG. 25 is a waveform timing chart illustrating an operation example during the read period according to a first modification of the third embodiment.

FIG. 25 is a waveform timing chart illustrating an operation example during the read period according to a first modification of the third embodiment. In also the detection device 1b according to the present embodiment, in an aspect, the refreshing period Pref may be provided for each unit of a predetermined number of lines in the same manner as in the embodiments described above. In the example illustrated in FIG. 25, the second reset period Prst2 is provided without providing the refreshing period Pref after the completion of the row read period VR(1) in the row corresponding to the gate drive signal Vgcl(1). Subsequently, the refreshing period Pref and the second reset period Prst2 are provided after the completion of the row read period VR(2) in the row corresponding to the gate drive signal Vgcl(2) adjacent to the gate drive signal Vgcl(1).

Second Modification

Figure 26:
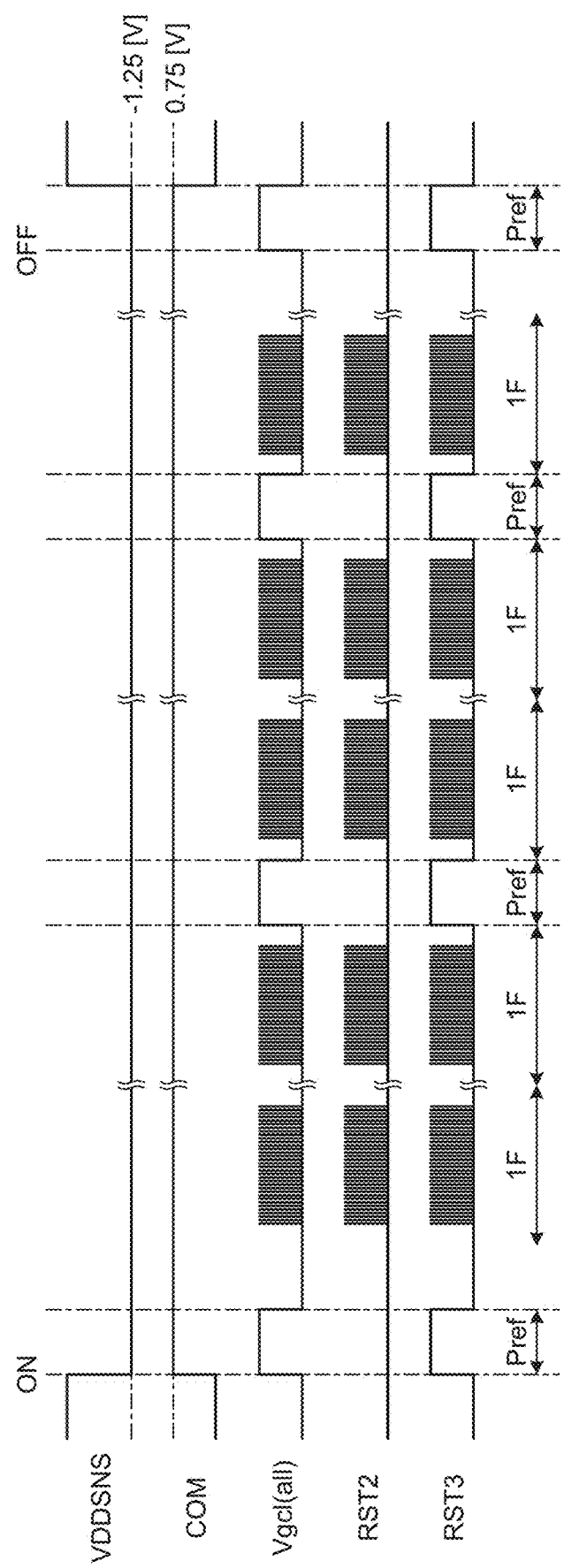
FIG. 26 is a diagram illustrating an example of the refreshing operation timing of the detection device according to a second modification of the third embodiment.

FIG. 26 is a diagram illustrating an example of the refreshing operation timing of the detection device according to a second modification of the third embodiment. In also the detection device 1b according to the present embodiment, in an aspect, the refreshing period Pref may be collectively provided for each unit of a predetermined number of frames in the same manner as in the embodiments described above. Alternatively, for example, in an aspect, the refreshing period Pref may be provided in the on-sequence of the detection circuit 48, that is, before the start of the normal detection operation of the detection circuit 48, in the same manner as in the embodiments described above. Further alternatively, for example, in an aspect, the refreshing period Pref may be provided in the off-sequence of the detection circuit 48, that is, after the completion of the normal detection operation of the detection circuit 48, in the same manner as in the embodiments described above.

Specifically, for example, the first gate line drive circuit 15a sets all the gate drive signals Vgcl to the high-level voltage, and the second gate line drive circuit 15b sets the refreshing signal RST3 to the high-level voltage, for each unit of a predetermined number of frames. In this case, the gate drive signals Vgcl(1), . . . , Vgcl(M) may be set to the high-level voltage, and the refreshing signals RST3 corresponding to the second gate lines GCL2 may be set to the high-level voltage. This operation can provide the refreshing period Pref in which the forward bias of 0.75 V is applied between the cathodes and the anodes of the optical sensors PD.

Specifically, for example, before the start of the normal detection operation of the detection circuit 48, the first gate line drive circuit 15a sets all the gate drive signals Vgcl to the high-level voltage, and the second gate line drive circuit 15b sets the refreshing signal RST3 to the high-level voltage. In this case, the gate drive signals Vgcl(1), . . . , Vgcl(M) may be set to the high-level voltage, and the refreshing signals RST3 corresponding to the second gate lines GCL2 may be set to the high-level voltage. This operation can provide the refreshing period Pref in which the forward bias of 0.75 V is applied between the cathodes and the anodes of the optical sensors PD.

Specifically, for example, after the completion of the normal detection operation of the detection circuit 48, the first gate line drive circuit 15a sets all the gate drive signals Vgcl to the high-level voltage, and the second gate line drive circuit 15b sets the refreshing signal RST3 to the high-level voltage. In this case, the gate drive signals Vgcl(1), . . . , Vgcl(M) may be set to the high-level voltage, and the refreshing signals RST3 corresponding to the second gate lines GCL2 may be set to the high-level voltage. This operation can provide the refreshing period Pref in which the forward bias of 0.75 V is applied between the cathodes and the anodes of the optical sensors PD.

Thus, by providing the refreshing period Pref in one or more of the following ways: for each unit of a predetermined number of frames, in the on-sequence of the detection circuit 48, and in the off-sequence of the detection circuit 48, the characteristics of the optical sensor PD (OPD) can be restored to the initial state even when variations are present in the organic semiconductor layer where the optical sensor PD is formed. That is, the detection accuracy of the detection device 1b according to the third embodiment can be restrained from decreasing.

Fourth Embodiment

Figure 27:
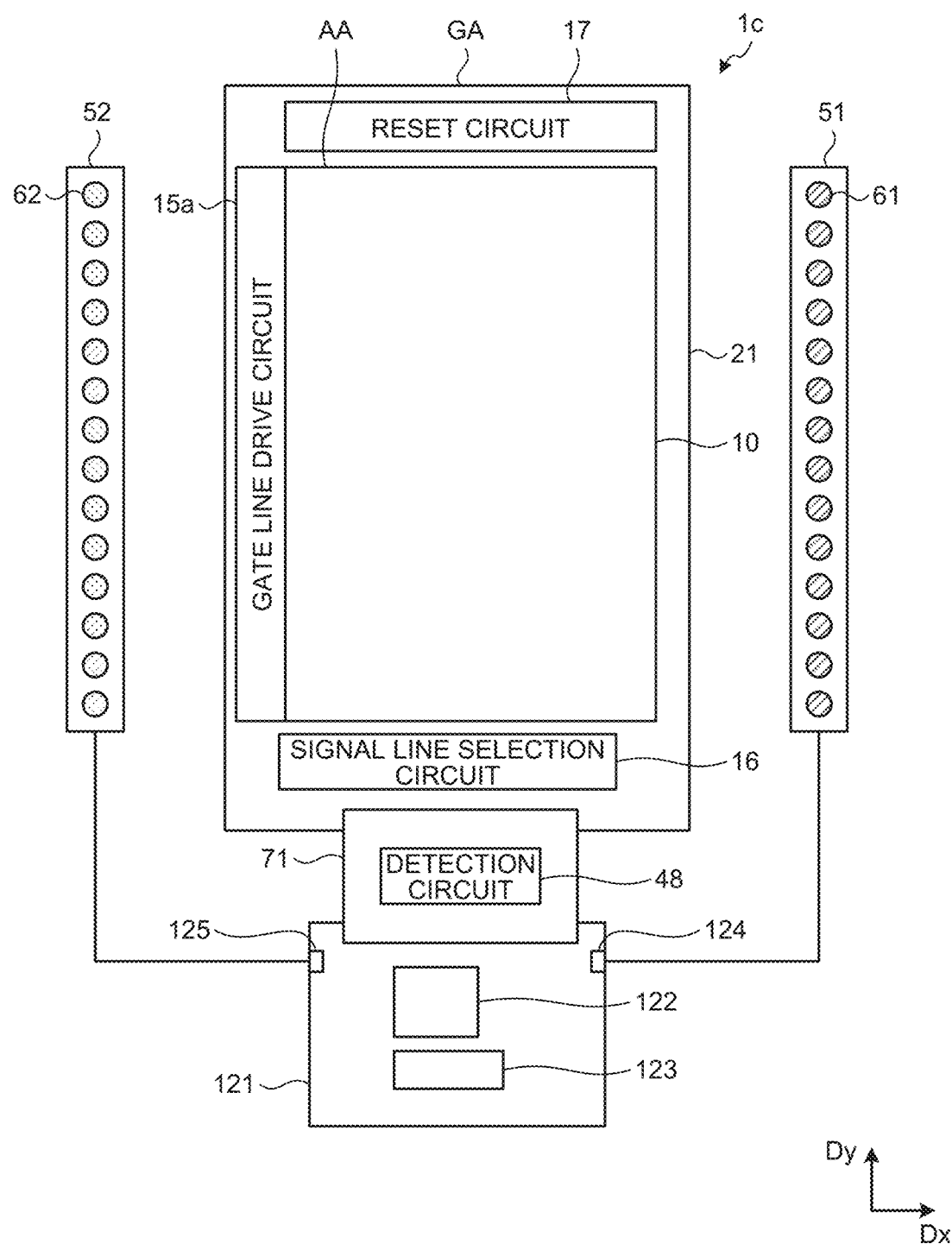
FIG. 27 is a plan view illustrating a detection device according to a fourth embodiment of the present disclosure.
Figure 28:
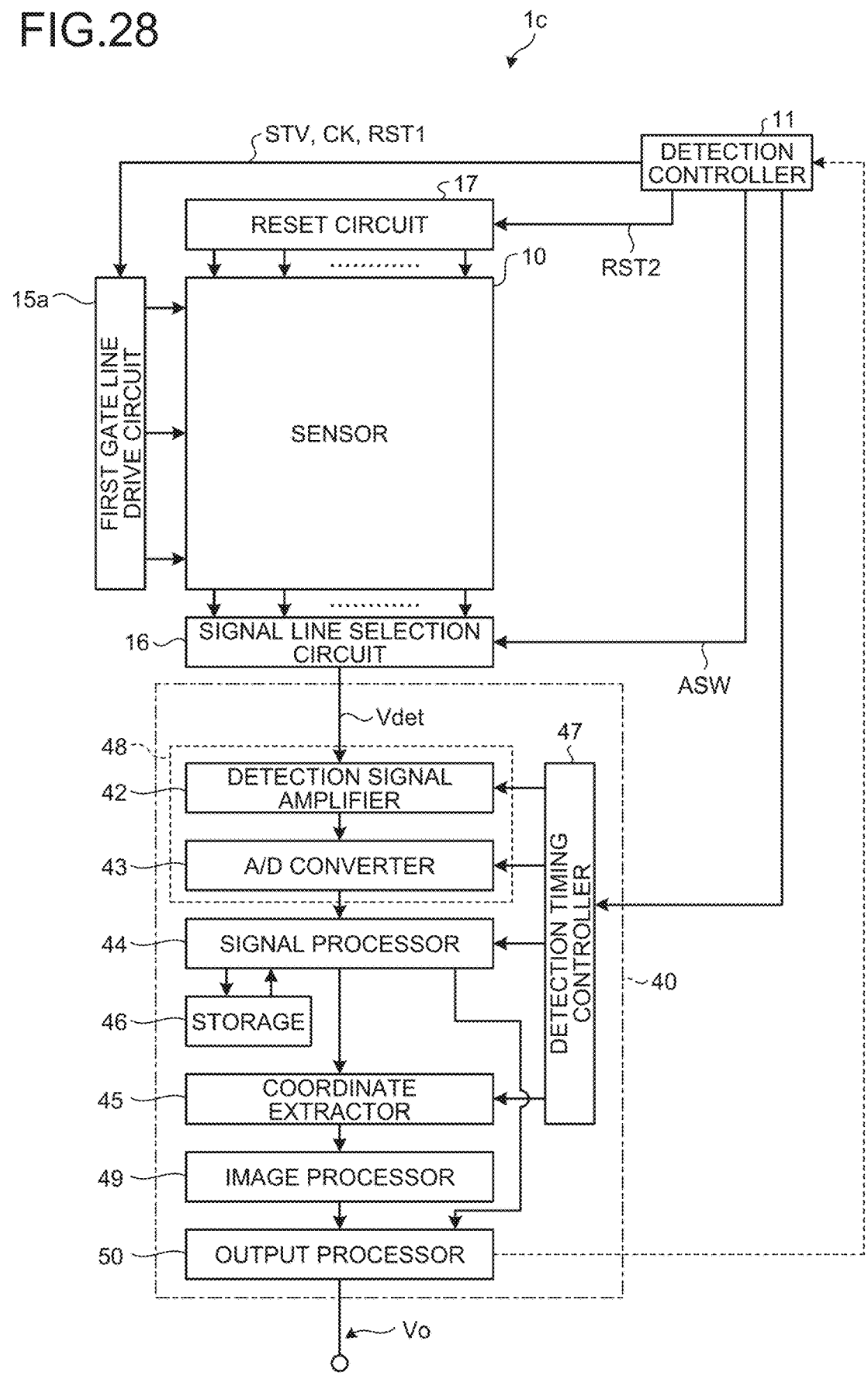
FIG. 28 is a block diagram illustrating a configuration example of the detection device according to the fourth embodiment.
Figure 29:
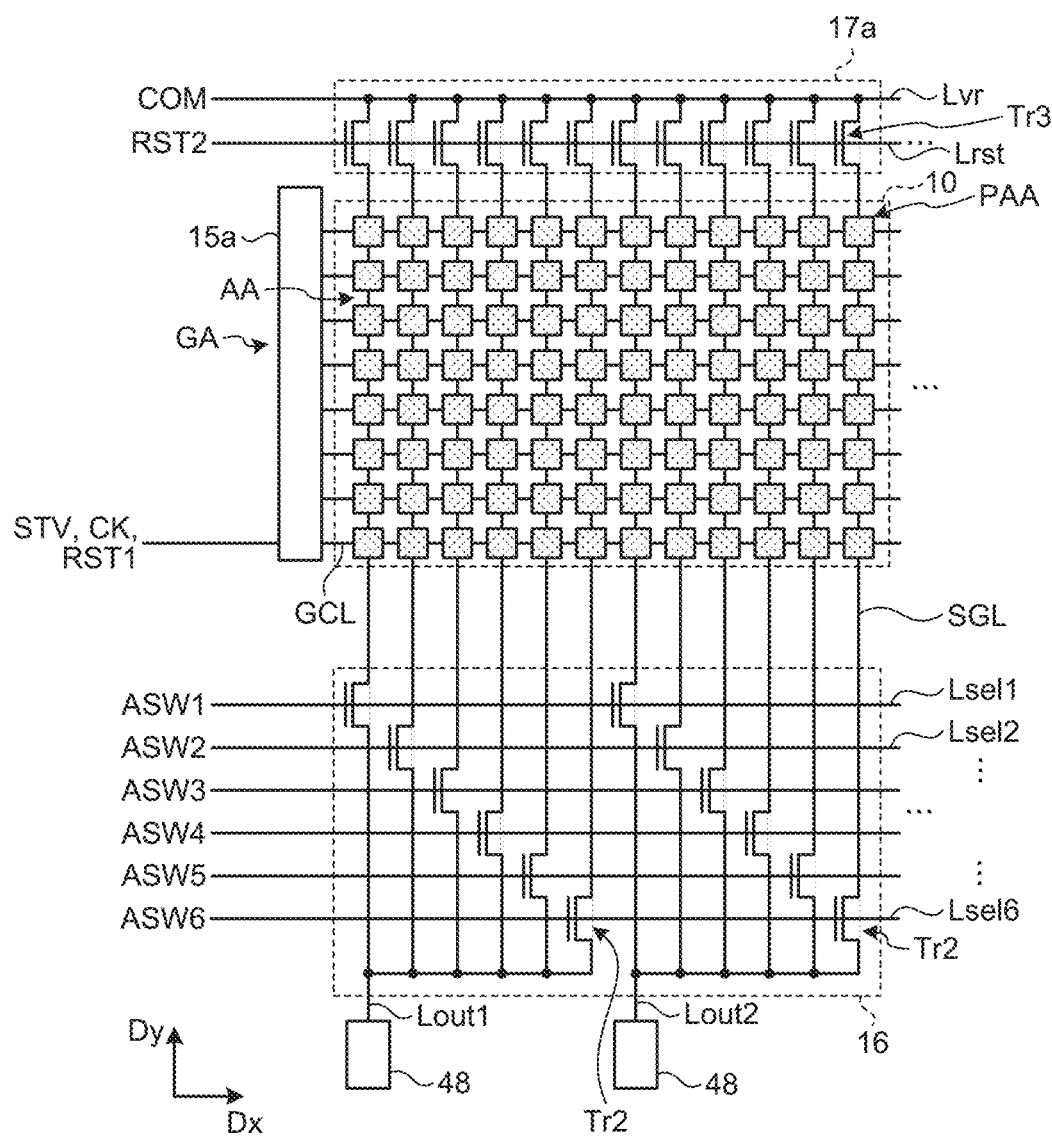
FIG. 29 is a circuit diagram illustrating the detection device according to the fourth embodiment.
Figure 30:
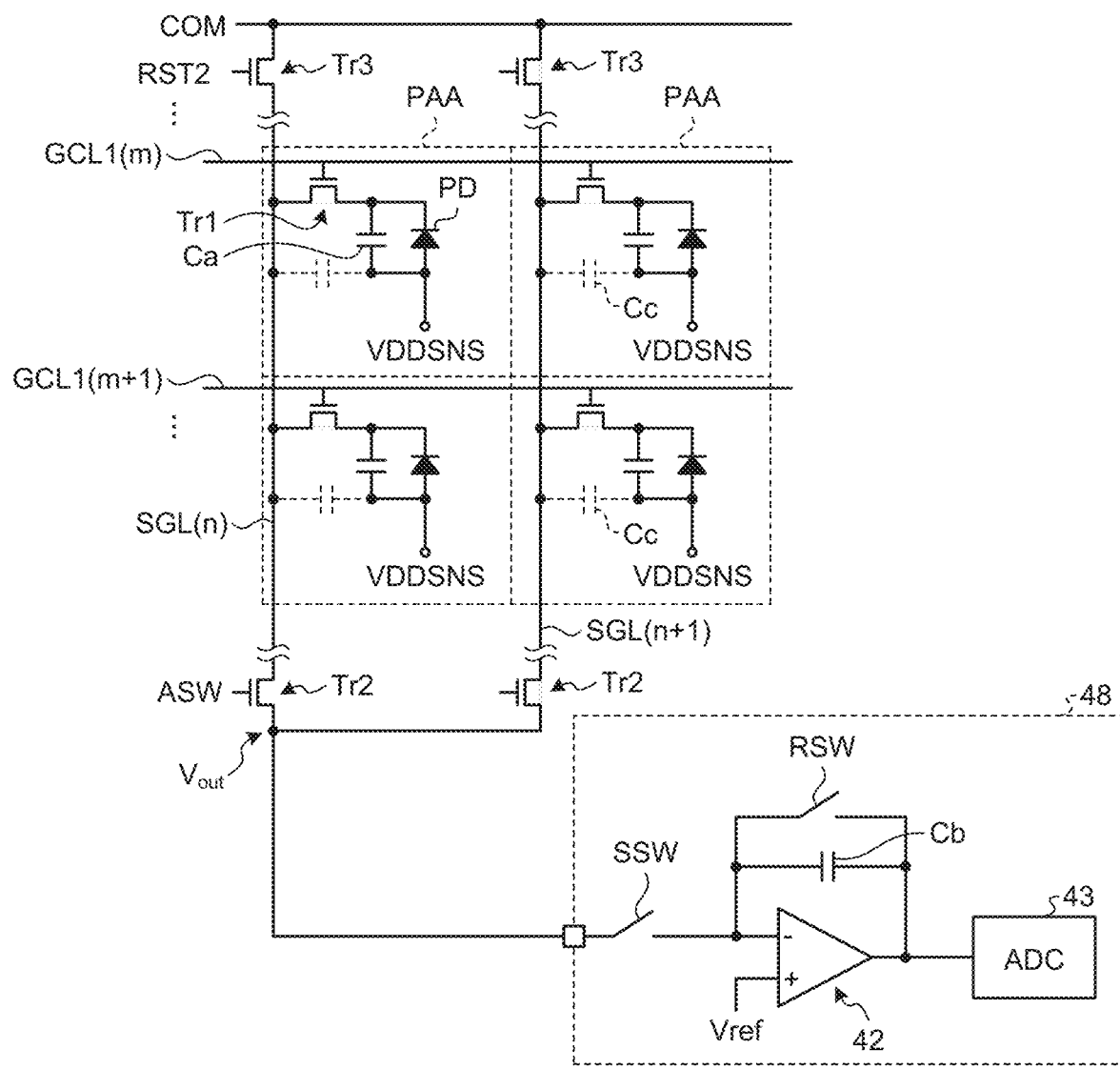
FIG. 30 is a circuit diagram illustrating the partial detection areas of the detection device according to the fourth embodiment.
Figure 31:
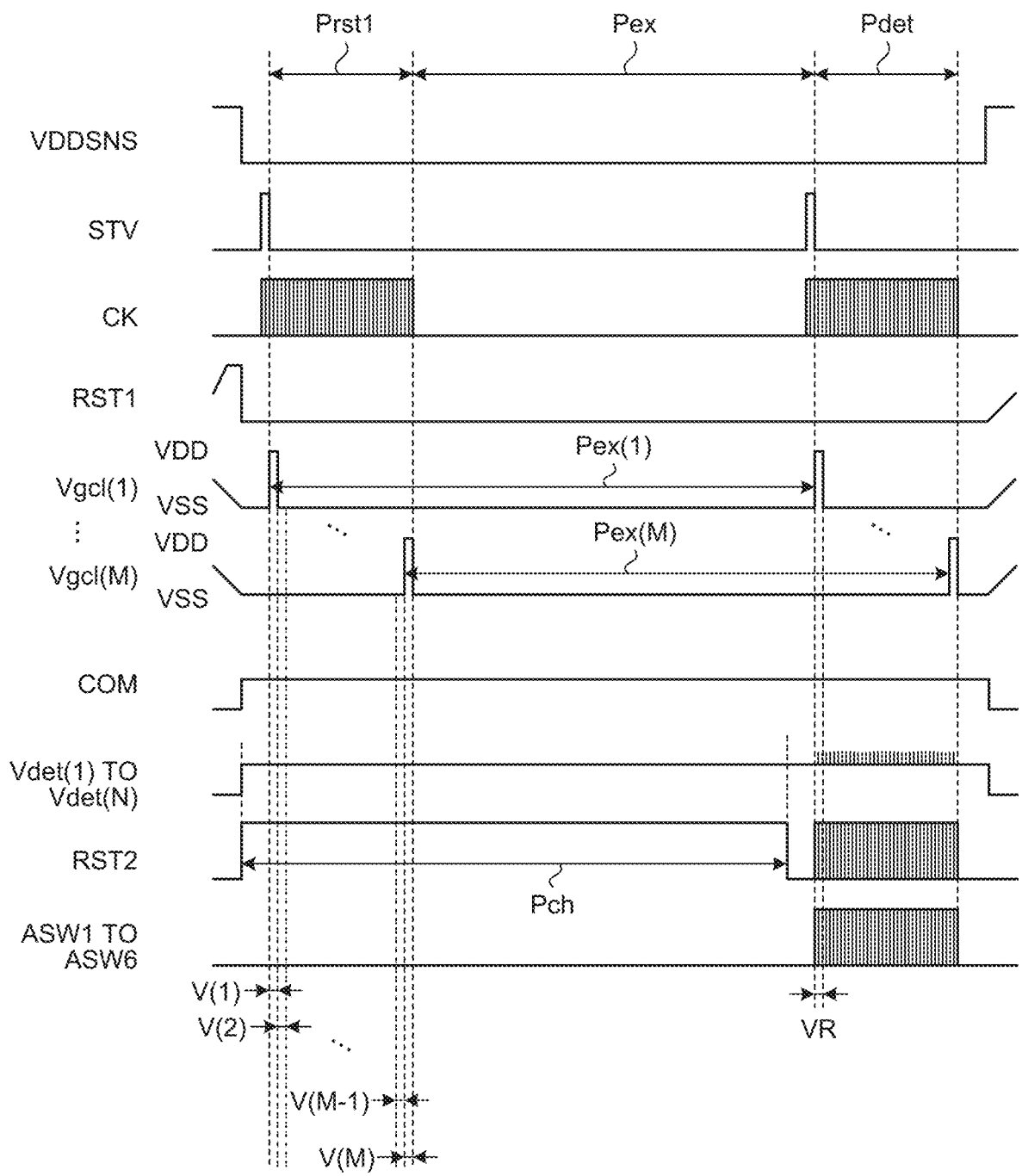
FIG. 31 is a waveform timing chart illustrating an operation example of the detection device according to the fourth embodiment.
Figure 32:
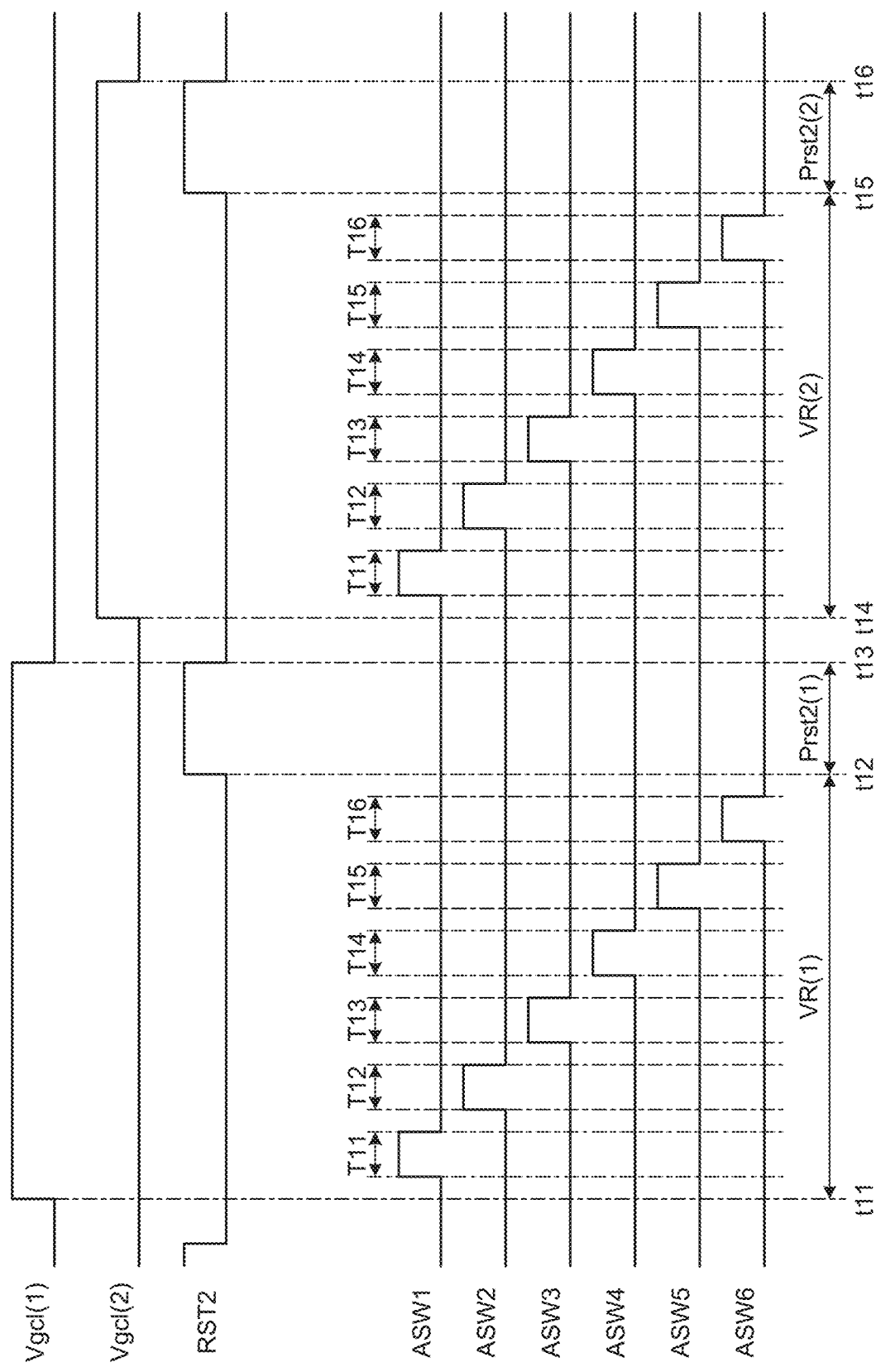
FIG. 32 is a waveform timing chart illustrating an operation example during the read period of the detection device according to the fourth embodiment.

FIG. 27 is a plan view illustrating a detection device according to a fourth embodiment of the present disclosure. FIG. 28 is a block diagram illustrating a configuration example of the detection device according to the fourth embodiment. FIG. 29 is a circuit diagram illustrating the detection device according to the fourth embodiment. FIG. 30 is a circuit diagram illustrating the partial detection areas of the detection device according to the fourth embodiment. FIG. 31 is a waveform timing chart illustrating an operation example of the detection device according to the fourth embodiment. FIG. 32 is a waveform timing chart illustrating an operation example during the read period of the detection device according to the fourth embodiment. In the following description, the same components as those described in any of the above-described embodiments are denoted by the same reference signs, and the description thereof will not be repeated.

As illustrated in FIGS. 27 to 30, a detection device 1c according to the fourth embodiment does not include a component corresponding to the second gate line drive circuit 15b of each of the embodiments described above. As illustrated in FIGS. 27 to 30, the detection device 1c also does not include a component corresponding to the second reset circuit 17ab of the third embodiment described above. The following describes an operation example of the detection device 1c according to the fourth embodiment with reference to FIGS. 31 and 32.

As illustrated in FIG. 31, the detection device 1c according to the fourth embodiment has the first reset period Prst1, the exposure period Pex, and the read period Pdet in the same manner as in each of the embodiments described above. The power supply circuit 123 supplies the sensor power supply potential VDDSNS to the anode of the optical sensor PD over the first reset period Prst1, the exposure period Pex, and the read period Pdet. The control circuit 122 sets the second reset signal RST2 to "H", and then, supplies the start signal STV and the clock signal CK to the first gate line drive circuit 15a to start the first reset period Prst1. During the first reset period Prst1, the control circuit 122 supplies the reference potential COM to the reset circuit 17 and uses the second reset signal RST2 to turn on the third switching elements Tr3 for supplying the reference potential COM. This operation supplies the reference potential COM to each of the signal lines SGL.

During the first reset period Prst1, the first gate line drive circuit 15a sequentially selects gate lines GCL1 based on the start signal STV, the clock signal CK, and the first reset signal RST1. The first gate line drive circuit 15a sequentially supplies the gate drive signals Vgcl (Vgcl(1), . . . , Vgcl(M)) to the gate lines GCL1. The gate drive signals Vgcl(1), . . . , Vgcl(M) are sequentially supplied to the respective gate lines GCL1. Thus, the first switching elements Tr1 are sequentially brought into a conducting state and supplied with the reference potential COM on a row-by-row basis. As a result, the capacitance of the capacitive elements Ca is reset.

Specifically, the first gate line drive circuit 15a supplies the gate drive signal Vgcl(1) at the high-level voltage (power supply voltage VDD) to a gate line GCL1(1) during the period V(1). The control circuit 122 supplies any one of the selection signals ASW1, . . . , ASW6 (for example, the selection signal ASW1) to the signal line selection circuit 16 during a period in which the gate drive signal Vgcl(1) is at the high-level voltage (power supply voltage VDD). This operation electrically couples the signal line SGL of the partial detection area PAA selected by the gate drive signal Vgcl(1) to the detection circuit 48. As a result, the reference potential COM is also supplied to the coupling wiring between the second switching elements Tr2 and the detection circuit 48.

In the same manner, the first gate line drive circuit 15a supplies the gate drive signals Vgcl(2), . . . , Vgcl(M−1), Vgcl(M) at the high-level voltage to gate lines GCL1(2), . . . , GCL1(M−1), GCL1(M) during the periods V(2), V(M−1), V(M), respectively.

Thus, during the first reset period Prst1, the capacitive elements Ca of all the partial detection areas PAA are sequentially electrically coupled to the signal lines SGL and are supplied with the reference potential COM. As a result, the capacitance of the capacitive elements Ca is reset. The capacitance of the capacitive elements Ca of some of the partial detection areas PAA can be reset by selecting some of the gate lines and the signal lines SGL.

A current flows correspondingly to the light received by the optical sensor PD in each of the partial detection areas PAA during the effective exposure periods SPex(1), . . . , SPex(M). As a result, an electric charge is stored in each of the capacitive elements Ca.

At a time before the read period Pdet starts, the control circuit 122 sets the second reset signal RST2 to the low-level voltage. This operation stops the operation of the reset circuit 17.

During the read period Pdet, the first gate line drive circuit 15a sequentially supplies the gate drive signals Vgcl(1), . . . , Vgcl(M) to the gate lines GCL1 in the same manner as during the first reset period Prst1. As a result, the detection signal Vdet for each of the partial detection areas PAA is supplied to the detection circuit 48.

In the same manner, the first gate line drive circuit 15a supplies the gate drive signals Vgcl(2), ..., Vgcl(M-1), Vgcl(M) at the high-level voltage to the gate lines GCL1(2), ..., GCL1(M-1), GCL1(M) during the row read periods VR(2), ..., VR(M-1), VR(M), respectively. That is, the first gate line drive circuit 15a supplies the gate drive signal Vgcl to the gate line GCL1 during each of the row read periods VR(1), VR(2), ..., VR(M-1), VR(M). The signal line selection circuit 16 sequentially selects the signal lines SGL based on the selection signal ASW during each period in which the gate drive signal Vgcl is set to the high-level voltage. The signal line selection circuit 16 sequentially electrically couples each of the signal lines SGL to one detection circuit 48. Thus, the detection device 1 can output the detection signals Vdet of all the partial detection areas PAA to the detection circuit 48 during the read period Pdet.

In also the present embodiment, the gate drive signal Vgcl is supplied to the first gate lines GCL1 row by row, and the first switching elements Tr1 belonging to the predetermined row are brought into a coupled state. Specifically, as illustrated in FIG. 32, the first gate line drive circuit 15a supplies the gate drive signal Vgcl(1) at the high-level voltage (power supply voltage VDD) to the gate line GCL1(1) at time t11. The row read period VR(1) starts at time t1*l* when the gate drive signal Vgcl(1) is set to the high-level voltage.

Specifically, the control circuit 122 sequentially supplies the selection signals ASW1, ..., ASW6 to the signal line selection circuit 16 during a period in which the gate drive signal Vgcl(1) is at the high-level voltage (power supply voltage VDD). As a result, the detection signal Vdet for each of the partial detection areas PAA is supplied to the detection circuit 48.

In FIG. 32, the selection signals ASW1, ..., ASW6 are supplied in the order of the periods T11, ..., T16 in a time-division manner. The control circuit 122 sets the selection signal ASW6 to the low-level voltage, and the reading of the last column ends. Thus, the row read period VR(1) ends.

At time t12 after the completion of the read period of the predetermined row (row read period VR(1)) and before the start of the read period of the next row (row read period VR(2)), the reference potential COM is supplied to the optical sensors PD belonging to the predetermined row and the signal lines SGL. Specifically, the control circuit 122 sets the second reset signal RST2 to the high-level voltage at time t12. This operation turns on the third switching elements Tr3 to supply the reference potential COM to the optical sensors PD corresponding to the gate line GCL(1) and the signal lines SGL.

Then, at time t13, the first gate line drive circuit 15a sets the gate drive signal Vgcl(1) to the low-level voltage. This operation brings the first switching elements Tr1 of the predetermined row into the non-coupled state. At time t13, the control circuit 122 sets the second reset signal RST2 to the low-level voltage. This operation ends the read period Pdet of the first row. Hereinafter, the period from time t12 to time t13 is referred to as "second reset period Prst2" in the present embodiment.

In FIG. 32, the time when the gate drive signal Vgcl(1) is set to the low-level voltage matches the time when the second reset signal RST2 is set to the low-level voltage at time t13. However, the timing is not limited thereto. The second reset signal RST2 may be set to the low-level voltage after a predetermined period has elapsed after the gate drive signal Vgcl(1) is set to the low-level voltage.

Then, at time t14, the first gate line drive circuit 15a supplies the gate drive signal Vgcl(2) at the high-level voltage (power supply voltage VDD) to the gate line GCL1(2) in the second row. Subsequently, in the same manner as in the first row, the read period Pdet of the second row is executed from time t14 to time t16. The detection for one frame can be performed by repeating the operation described above to the last row (gate line GCL1(256)).

In also the present embodiment, the second reset period Prst2 is provided for each of the row read periods VR. Therefore, even if the signal line SGL is charged after a predetermined column (for example, SGL(1)) is read, the signal line SGL is reset before the row read period VR for the next row. However, the refreshing period Pref cannot be provided before the second reset period Prst2 for each of the row read periods VR in the same manner as in each of the embodiments described above. Therefore, in the same manner as in the second modification of each of the embodiments described above, the refreshing period Pref needs to be provided for each unit of a predetermined number of frames, or in the on-sequence or the off-sequence of the detection circuit 48.

Figure 33:
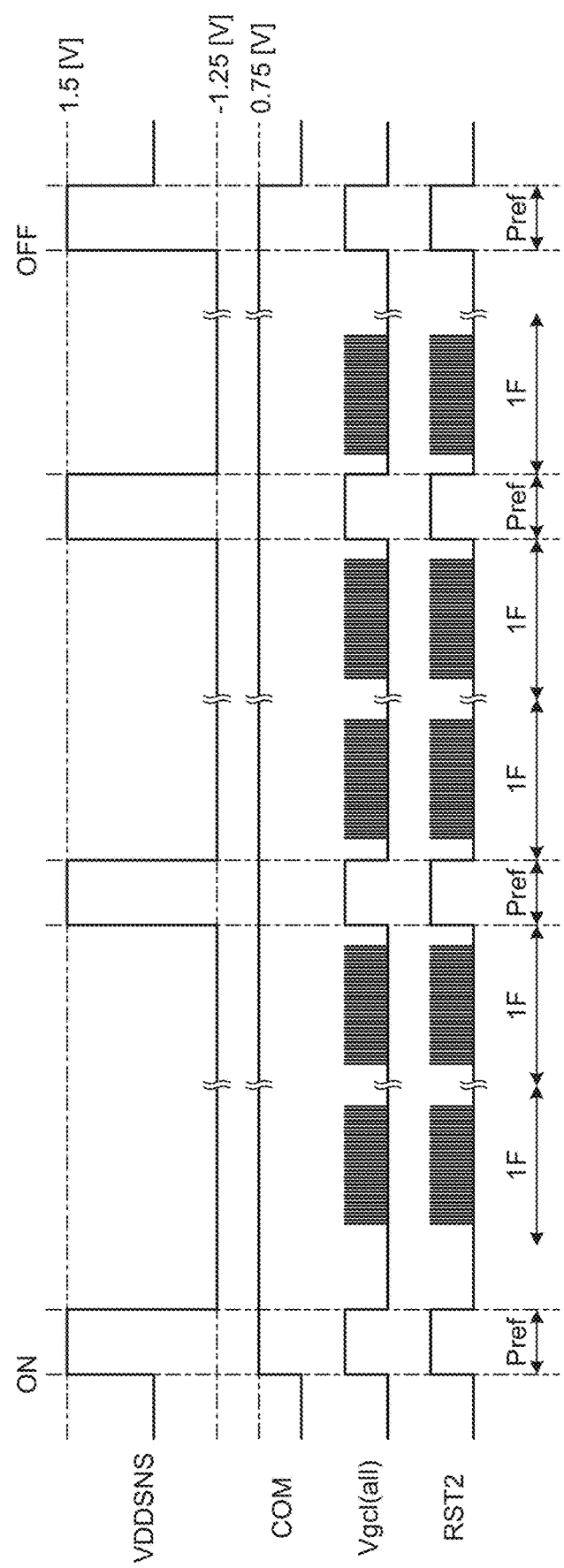
FIG. 33 is a diagram illustrating an example of the refreshing operation timing of the detection device according to the fourth embodiment.

FIG. 33 is a diagram illustrating an example of the refreshing operation timing of the detection device according to the fourth embodiment. In the detection device 1c according to the present embodiment, the refreshing period Pref is, for example, collectively provided for each unit of a predetermined number of frames in the same manner as in the second modification of each of the embodiments described above. Alternatively, for example, the refreshing period Pref is provided in the on-sequence of the detection circuit 48, that is, before the start of the normal detection operation of the detection circuit 48, in the same manner as in the second modification of each of the embodiments described above. Further alternatively, for example, the refreshing period Pref is provided in the off-sequence of the detection circuit 48, that is, after the completion of the normal detection operation of the detection circuit 48, in the same manner as in the second modification of each of the embodiments described above.

Specifically, for example, for each unit of a predetermined number of frames, the power supply circuit 123 sets the sensor power supply potential VDDSNS to the refreshing potential of 1.5 V; the first gate line drive circuit 15a sets all the gate drive signals Vgcl to the high-level voltage; and the control circuit 122 sets the second reset signal RST2 to the high-level voltage. This operation can provide the refreshing period Pref in which the forward bias of 0.75 V is applied between the cathodes and the anodes of the optical sensors PD.

Specifically, for example, before the start of the normal detection operation of the detection circuit 48, the power supply circuit 123 sets the sensor power supply potential VDDSNS to the refreshing potential of 1.5 V; the first gate line drive circuit 15a sets all the gate drive signals Vgcl to the high-level voltage; and the control circuit 122 sets the second reset signal RST2 to the high-level voltage. This operation can provide the refreshing period Pref in which the forward bias of 0.75 V is applied between the cathodes and the anodes of the optical sensors PD.

Specifically, for example, after the completion of the normal detection operation of the detection circuit 48, the power supply circuit 123 sets the sensor power supply potential VDDSNS to the refreshing potential of 1.5 V; the first gate line drive circuit 15a sets all the gate drive signals Vgcl to the high-level voltage; and the control circuit 122 sets the second reset signal RST2 to the high-level voltage.

This operation can provide the refreshing period Pref in which the forward bias of 0.75 V is applied between the cathodes and the anodes of the optical sensors PD.

Thus, in the fourth embodiment, by providing the refreshing period Pref in one or more of the following ways: for each unit of a predetermined number of frames, in the on-sequence of the detection circuit 48, and in the off-sequence of the detection circuit 48, the characteristics of the optical sensor PD (OPD) can be restored to the initial state even when variations are present in the organic semiconductor layer where the optical sensor PD is formed. That is, the detection accuracy of the detection device 1c according to the fourth embodiment can be restrained from decreasing.

In each of the embodiments described above, the detection is not performed during the refreshing period. Therefore, in an aspect, the first and the second light sources 61 and 62 may be turned off during the refreshing period and turned on only during the period when the normal detection operation is being performed.

The components in the embodiments described above can be combined with each other as appropriate. Other operational advantages accruing from the aspects described in the embodiments herein that are obvious from the description herein or that are appropriately conceivable by those skilled in the art will naturally be understood as accruing from the present disclosure.

What is claimed is:

1. A detection device comprising:
   a plurality of optical sensors arranged in a matrix having a row-column configuration;
   a first gate line drive circuit configured to supply a gate drive signal to the optical sensors arranged in a row direction;
   a second gate line drive circuit configured to supply a refreshing signal to supply a forward bias potential to the optical sensors arranged in the row direction during a refreshing period in which a refreshing operation is performed;
   a reset circuit configured to supply a reference potential to reverse-bias the optical sensors arranged in a column direction; and
   a detection circuit configured to be supplied with a signal from each of the optical sensors arranged in the column direction,
   wherein
   each of the optical sensors is configured to be switchable alternately between a reverse-bias state and a forward-bias state, and
   the detection device is configured to:
      detect the signal that is output from each of the optical sensors by reverse-biasing the optical sensor,
      perform the refreshing operation to restore characteristics of the optical sensor to an initial state by forward-biasing the optical sensor for each predetermined period, and
      switch the optical sensor from the reverse-bias state to the forward-bias state at predetermined intervals to perform the refreshing operation.

2. The detection device according to claim 1, wherein the second gate line drive circuit is configured to supply the refreshing signal for each row read period.

3. The detection device according to claim 1, wherein the second gate line drive circuit is configured to supply the refreshing signal for each read period of a predetermined row.

4. The detection device according to claim 1, wherein the second gate line drive circuit is configured to collectively supply the refreshing signal for each unit of a predetermined number of frames.

5. The detection device according to claim 1, wherein the second gate line drive circuit is configured to supply the refreshing signal in an on-sequence of the detection circuit.

6. The detection device according to claim 1, wherein the second gate line drive circuit is configured to supply the refreshing signal in an off-sequence of the detection circuit.

7. The detection device according to claim 1, configured to turn off a light source when the refreshing operation is performed.

8. A detection device comprising:
   a plurality of optical sensors arranged in a matrix having a row-column configuration;
   a first gate line drive circuit configured to supply a gate drive signal to the optical sensors arranged in a row direction;
   a second gate line drive circuit configured to supply a refreshing signal to supply a forward bias potential to the optical sensors arranged in the row direction; and
   a detection circuit configured to be supplied with the signal from each of the optical sensors arranged in the column direction, wherein
   the detection device is configured to:
      detect a signal that is output from each of the optical sensors by reverse-biasing the optical sensor,
      perform a refreshing operation to restore characteristics of the optical sensor to an initial state by forward-biasing the optical sensor for each predetermined period, and
      supply a reference potential to reverse-bias the optical sensors during a refreshing period in which the refreshing operation is performed.

9. The detection device according to claim 8, wherein the second gate line drive circuit is configured to supply the refreshing signal for each row read period.

10. The detection device according to claim 8, wherein the second gate line drive circuit is configured to supply the refreshing signal for each read period of a predetermined row.

11. The detection device according to claim 8, wherein the second gate line drive circuit is configured to collectively supply the refreshing signal for each unit of a predetermined number of frames.

12. The detection device according to claim 8, wherein the second gate line drive circuit is configured to supply the refreshing signal in an on-sequence of the detection circuit.

13. The detection device according to claim 8, wherein the second gate line drive circuit is configured to supply the refreshing signal in an off-sequence of the detection circuit.

14. A detection device comprising a plurality of optical sensors arranged in a matrix having a row-column configuration, wherein
   the detection device is configured to:
      detect a signal that is output from each of the optical sensors by reverse-biasing the optical sensor, and
      perform a refreshing operation to restore characteristics of the optical sensor to an initial state by forward-biasing the optical sensor for each predetermined period, and
   the detection device further comprises:
      a gate line drive circuit configured to supply a gate drive signal to the optical sensors arranged in a row direction;

a first reset circuit configured to supply a reference potential to reverse-bias the optical sensors arranged in a column direction;

a second reset circuit configured to supply a refreshing potential to forward-bias the optical sensors arranged in the row direction during a refreshing period in which the refreshing operation is performed; and a detection circuit configured to be supplied with the signal from each of the optical sensors arranged in the column direction.

15. The detection device according to claim 14, wherein the second reset circuit is configured to supply the refreshing potential for each row read period.

16. The detection device according to claim 14, wherein the second reset circuit is configured to supply the refreshing potential for each read period of a predetermined row.

17. The detection device according to claim 14, wherein the second reset circuit is configured to collectively supply the refreshing potential for each unit of a predetermined number of frames.

18. The detection device according to claim 14, wherein the second reset circuit is configured to supply the refreshing potential in an on-sequence of the detection circuit.

19. The detection device according to claim 14, wherein the second reset circuit is configured to supply the refreshing potential in an off-sequence of the detection circuit.

20. A detection device comprising a plurality of optical sensors arranged in a matrix having a row-column configuration, wherein the detection device is configured to:
   detect a signal that is output from each of the optical sensors by reverse-biasing the optical sensor, and
   perform a refreshing operation to restore characteristics of the optical sensor to an initial state by forward-biasing the optical sensor for each predetermined period, and the detection device further comprises:
   a gate line drive circuit configured to supply a gate drive signal to the optical sensors arranged in a row direction;
   a reset circuit configured to supply a reference potential to reverse-bias the optical sensors arranged in a column direction;
   a power supply circuit configured to supply a refreshing potential to forward-bias the optical sensors during a refreshing period in which the refreshing operation is performed; and
   a detection circuit configured to be supplied with the signal from each of the optical sensors arranged in the column direction.

21. The detection device according to claim 20, wherein the power supply circuit is configured to collectively supply the refreshing potential for each unit of a predetermined number of frames.

22. The detection device according to claim 20, wherein the power supply circuit is configured to supply the refreshing potential in an on-sequence of the detection circuit.

23. The detection device according to claim 20, wherein the power supply circuit is configured to supply the refreshing potential in an off-sequence of the detection circuit.

* * * * *